United States Patent
Chen et al.

(10) Patent No.: US 6,988,942 B2
(45) Date of Patent: Jan. 24, 2006

(54) CONDUCTIVE POLISHING ARTICLE FOR ELECTROCHEMICAL MECHANICAL POLISHING

(75) Inventors: Liang-Yuh Chen, Foster City, CA (US); Yuchun Wang, San Jose, CA (US); Yan Wang, Sunnyvale, CA (US); Alain Duboust, Sunnyvale, CA (US); Daniel A. Carl, Pleasanton, CA (US); Ralph Wadensweiler, Sunnyvale, CA (US); Manoocher Birang, Los Gatos, CA (US); Paul D. Butterfield, San Jose, CA (US); Rashid Mavliev, Santa Clara, CA (US); Stan D. Tsai, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/894,756

(22) Filed: Jul. 20, 2004

(65) Prior Publication Data

US 2004/0266327 A1  Dec. 30, 2004

Related U.S. Application Data

(63) Continuation of application No. 10/033,732, filed on Dec. 27, 2001, and a continuation-in-part of application No. 09/505,899, filed on Feb. 17, 2000, now Pat. No. 6,537,144, and a continuation-in-part of application No. 10/026,854, filed on Dec. 20, 2001.

(60) Provisional application No. 60/326,263, filed on Oct. 1, 2001, provisional application No. 60/286,107, filed on Apr. 24, 2001, provisional application No. 60/258,162, filed on Dec. 22, 2000.

(51) Int. Cl.
   *B24D 11/00* (2006.01)

(52) U.S. Cl. ..................................... 451/533; 451/527
(58) Field of Classification Search ................ 451/527, 451/533, 534
See application file for complete search history.

(56) References Cited

U.S. PATENT DOCUMENTS

| 1,601,642 A | 9/1926 | Parker |
| 1,927,162 A | 9/1933 | Fiedler et al. |
| 2,112,691 A | 3/1938 | Crowder |
| 2,240,265 A | 4/1941 | Nachtman |

(Continued)

FOREIGN PATENT DOCUMENTS

EP    0 325 753    8/1969

(Continued)

OTHER PUBLICATIONS

Nogami; An Annovation to Intregrate Porous Low-K Materials and Copper; *Interconnect Japan 2001*; Honeywell Seminar Dec. 6, 2001; pp. 1-12.

(Continued)

*Primary Examiner*—David B. Thomas
(74) *Attorney, Agent, or Firm*—Patterson & Sheridan

(57) ABSTRACT

An article of manufacture and apparatus are provided for planarizing a substrate surface. In one aspect, an article of manufacture is provided for polishing a substrate including polishing article comprising a body having at least a partially conductive surface adapted to polish the substrate and a mounting surface. A plurality of perforations may be formed in the polishing article for flow of material therethrough. In another aspect, a polishing article for polishing a substrate includes a body having a polishing surface and a conductive element disposed therein. The conductive element may have a contact surface that extends beyond a plane defined by the polishing surface. The polishing surface may have one or more pockets formed therein. The conductive element may be disposed in each of the polishing pockets.

18 Claims, 16 Drawing Sheets

U.S. PATENT DOCUMENTS

| | | |
|---|---|---|
| 2,392,687 A | 1/1946 | Nachtman |
| 2,431,065 A | 11/1947 | Miller |
| 2,451,341 A | 10/1948 | Jemstedt |
| 2,453,481 A | 11/1948 | Wilson |
| 2,454,935 A | 11/1948 | Miller |
| 2,456,185 A | 12/1948 | Grube |
| 2,457,510 A | 12/1948 | van Omum |
| 2,458,676 A | 1/1949 | Brenner et al. |
| 2,461,556 A | 2/1949 | Long |
| 2,473,290 A | 6/1949 | Millard |
| 2,477,808 A | 8/1949 | Jones |
| 2,479,323 A | 8/1949 | Davis |
| 2,480,022 A | 8/1949 | Hogaboom |
| 2,490,055 A | 12/1949 | Hoff |
| 2,495,695 A | 1/1950 | Camin et al. |
| 2,500,205 A | 3/1950 | Schaefer |
| 2,500,206 A | 3/1950 | Schaefer et al. |
| 2,503,863 A | 4/1950 | Bart |
| 2,506,794 A | 5/1950 | Kennedy et al. |
| 2,509,304 A | 5/1950 | Klein |
| 2,512,328 A | 6/1950 | Hays |
| 2,517,907 A | 8/1950 | Mikulas |
| 2,519,945 A | 8/1950 | Twele et al. |
| 2,530,677 A | 11/1950 | Berkenkotter et al. |
| 2,535,966 A | 12/1950 | Teplitz |
| 2,536,912 A | 1/1951 | Cobertt |
| 2,539,898 A | 1/1951 | Davis |
| 2,540,175 A | 2/1951 | Rosenqvist |
| 2,544,510 A | 3/1951 | Prahl |
| 2,549,678 A | 4/1951 | Flandt |
| 2,554,943 A | 5/1951 | Farmer |
| 2,556,017 A | 6/1951 | Vonada |
| 2,560,534 A | 7/1951 | Adler |
| 2,560,966 A | 7/1951 | Lee |
| 2,569,577 A | 10/1951 | Reading |
| 2,569,578 A | 10/1951 | Rieger |
| 2,571,709 A | 10/1951 | Gray |
| 2,576,074 A | 11/1951 | Nachtman |
| 2,587,630 A | 3/1952 | Konrad et al. |
| 2,619,454 A | 11/1952 | Zapponi |
| 2,633,452 A | 3/1953 | Hogaboom, Jr. et al. |
| 2,646,398 A | 7/1953 | Henderson |
| 2,656,283 A | 10/1953 | Fink et al. |
| 2,656,284 A | 10/1953 | Toulmin |
| 2,657,177 A | 10/1953 | Rendel |
| 2,657,457 A | 11/1953 | Toulmin |
| 2,673,836 A | 3/1954 | Vonada |
| 2,674,550 A | 4/1954 | Dunlevy et al. |
| 2,675,348 A | 4/1954 | Greenspan |
| 2,680,710 A | 6/1954 | Kenmore et al. |
| 2,684,939 A | 7/1954 | Geese |
| 2,689,215 A | 9/1954 | Bart |
| 2,695,269 A | 11/1954 | de Witz et al. |
| 2,696,859 A | 12/1954 | Somma |
| 2,698,832 A | 1/1955 | Swanson |
| 2,706,173 A | 4/1955 | Wells et al. |
| 2,706,175 A | 4/1955 | Licharz |
| 2,708,445 A | 5/1955 | Manson et al. |
| 2,710,834 A | 6/1955 | Vrilakas |
| 2,711,993 A | 6/1955 | Lyon |
| 3,162,588 A | 12/1964 | Bell |
| 3,334,041 A | 8/1967 | Dyer et al. |
| 3,433,730 A | 3/1969 | Kennedy et al. |
| 3,448,023 A | 6/1969 | Bell |
| 3,476,677 A | 11/1969 | Corley et al. |
| 3,607,707 A | 9/1971 | Chenevier |
| 3,873,512 A | 3/1975 | Latanision |
| 3,942,959 A | 3/1976 | Markoo et al. |
| 3,992,178 A | 11/1976 | Markoo et al. |
| 4,047,902 A * | 9/1977 | Wiand .................. 51/295 |
| 4,082,638 A | 4/1978 | Jumer |
| 4,119,515 A | 10/1978 | Costakis |
| 4,125,444 A | 11/1978 | Inoue |
| 4,312,716 A | 1/1982 | Maschler et al. |
| 4,523,411 A | 6/1985 | Freerks |
| 4,704,511 A | 11/1987 | Miyano |
| 4,713,149 A | 12/1987 | Hoshino |
| 4,752,371 A | 6/1988 | Kreisel et al. |
| 4,772,361 A | 9/1988 | Dorsett et al. |
| 4,793,895 A | 12/1988 | Kaanta et al. |
| 4,839,993 A | 6/1989 | Masuko et al. |
| 4,934,102 A | 6/1990 | Leach et al. |
| 4,954,141 A | 9/1990 | Takiyama et al. |
| 4,956,056 A | 9/1990 | Zubatova et al. |
| 5,011,510 A | 4/1991 | Hayakawa et al. |
| 5,061,294 A | 10/1991 | Harmer et al. |
| 5,066,370 A | 11/1991 | Andreshak et al. |
| 5,096,550 A | 3/1992 | Mayer et al. |
| 5,108,463 A | 4/1992 | Buchanan |
| 5,136,817 A | 8/1992 | Tabata et al. |
| 5,137,542 A * | 8/1992 | Buchanan et al. ............ 51/295 |
| 5,203,884 A | 4/1993 | Buchanan et al. |
| 5,217,586 A | 6/1993 | Datta et al. |
| 5,225,034 A | 7/1993 | Yu et al. |
| 5,257,478 A | 11/1993 | Hyde et al. |
| 5,328,716 A | 7/1994 | Buchanan |
| 5,478,435 A | 12/1995 | Murphy et al. |
| 5,534,106 A | 7/1996 | Cote et al. |
| 5,543,032 A | 8/1996 | Datta et al. |
| 5,560,753 A * | 10/1996 | Schnabel et al. ............ 51/295 |
| 5,562,529 A | 10/1996 | Kishii et al. |
| 5,567,300 A | 10/1996 | Datta et al. |
| 5,575,706 A | 11/1996 | Tsai et al. |
| 5,578,362 A | 11/1996 | Reinhardt et al. |
| 5,624,300 A | 4/1997 | Kishii et al. |
| 5,633,068 A | 5/1997 | Ryoke et al. |
| 5,654,078 A | 8/1997 | Ferronato |
| 5,702,811 A * | 12/1997 | Ho et al. .................... 428/323 |
| 5,738,574 A | 4/1998 | Tolles et al. |
| 5,804,507 A | 9/1998 | Perlov et al. |
| 5,807,165 A | 9/1998 | Uzoh et al. |
| 5,823,854 A | 10/1998 | Chen |
| 5,840,190 A | 11/1998 | Scholander et al. |
| 5,840,629 A | 11/1998 | Carpio |
| 5,846,882 A | 12/1998 | Birang |
| 5,871,392 A | 2/1999 | Meikle et al. |
| 5,882,491 A | 3/1999 | Wardle |
| 5,893,796 A | 4/1999 | Birang et al. |
| 5,911,619 A | 6/1999 | Uzoh et al. |
| 5,938,801 A | 8/1999 | Robinson |
| 5,948,697 A | 9/1999 | Hata |
| 5,985,093 A | 11/1999 | Chen |
| 6,001,008 A | 12/1999 | Fujimori et al. |
| 6,004,880 A | 12/1999 | Liu et al. |
| 6,017,265 A | 1/2000 | Cook et al. |
| 6,020,264 A | 2/2000 | Lustig et al. |
| 6,024,630 A | 2/2000 | Shendon et al. |
| 6,033,293 A | 3/2000 | Crevasse et al. |
| 6,056,851 A | 5/2000 | Hsieh et al. |
| 6,066,030 A | 5/2000 | Uzoh |
| 6,074,284 A | 6/2000 | Tani et al. |
| 6,077,337 A | 6/2000 | Lee |
| 6,090,239 A | 7/2000 | Liu et al. |
| 6,103,096 A | 8/2000 | Datta et al. |
| 6,116,998 A | 9/2000 | Damgaard et al. |
| 6,153,043 A | 11/2000 | Edelstein et al. |
| 6,156,124 A | 12/2000 | Tobin |
| 6,159,079 A | 12/2000 | Zuniga et al. |
| 6,171,467 B1 | 1/2001 | Weihs et al. |
| 6,176,992 B1 | 1/2001 | Talieh |
| 6,176,998 B1 | 1/2001 | Wardle et al. |
| 6,183,354 B1 | 2/2001 | Zuniga et al. |
| 6,190,494 B1 | 2/2001 | Dow |
| 6,210,257 B1 | 4/2001 | Carlson |

| | | | |
|---|---|---|---|
| 6,234,870 B1 | 5/2001 | Uzoh et al. |
| 6,238,271 B1 | 5/2001 | Cesna |
| 6,238,592 B1 | 5/2001 | Hardy et al. |
| 6,244,935 B1 | 6/2001 | Birang et al. |
| 6,248,222 B1 | 6/2001 | Wang |
| 6,251,235 B1 | 6/2001 | Talieh et al. |
| 6,261,168 B1 | 7/2001 | Jensen et al. |
| 6,261,959 B1 | 7/2001 | Travis et al. |
| 6,273,798 B1 | 8/2001 | Berman |
| 6,297,159 B1 | 10/2001 | Paton |
| 6,319,108 B1 * | 11/2001 | Adefris et al. ............... 451/533 |
| 6,319,420 B1 | 11/2001 | Dow |
| 6,328,642 B1 | 12/2001 | Pant et al. |
| 6,328,872 B1 | 12/2001 | Talieh et al. |
| 6,331,135 B1 | 12/2001 | Sabde et al. |
| 6,368,184 B1 | 4/2002 | Beckage |
| 6,368,190 B1 | 4/2002 | Easter et al. |
| 6,381,169 B1 | 4/2002 | Bocian et al. |
| 6,383,066 B1 | 5/2002 | Chen et al. |
| 6,386,956 B1 | 5/2002 | Sato et al. |
| 6,391,166 B1 | 5/2002 | Wang |
| 6,395,152 B1 | 5/2002 | Wang |
| 6,402,591 B1 | 6/2002 | Thornton |
| 6,406,363 B1 | 6/2002 | Xu et al. |
| 6,409,904 B1 | 6/2002 | Uzoh et al. |
| 6,428,394 B1 | 8/2002 | Mooring et al. |
| 6,431,968 B1 | 8/2002 | Chen et al. |
| 6,440,295 B1 | 8/2002 | Wang |
| 6,447,668 B1 | 9/2002 | Wang |
| 6,471,847 B2 | 10/2002 | Talieh et al. |
| 6,475,332 B1 | 11/2002 | Boyd et al. |
| 6,482,307 B2 | 11/2002 | Ashjaee et al. |
| 6,497,800 B1 | 12/2002 | Talieh et al. |
| 6,517,426 B2 | 2/2003 | Lee |
| 6,520,843 B1 | 2/2003 | Halley |
| 6,537,140 B1 * | 3/2003 | Miller et al. ................ 451/259 |
| 6,537,144 B1 | 3/2003 | Tsai et al. |
| 6,551,179 B1 | 4/2003 | Halley |
| 6,561,889 B1 | 5/2003 | Xu et al. |
| 6,569,004 B1 | 5/2003 | Pham |
| 6,572,463 B1 | 6/2003 | Xu et al. |
| 6,585,579 B2 | 7/2003 | Jensen et al. |
| 6,630,059 B1 | 10/2003 | Uzoh et al. |
| 6,656,019 B1 * | 12/2003 | Chen et al. ................... 451/41 |
| 6,685,548 B2 * | 2/2004 | Chen et al. ................. 451/526 |
| 6,739,951 B2 | 5/2004 | Sun et al. |
| 6,752,700 B2 * | 6/2004 | Duescher .................... 451/59 |
| 6,769,969 B1 * | 8/2004 | Duescher .................... 451/59 |
| 6,811,680 B2 | 11/2004 | Chen |
| 6,848,977 B1 | 2/2005 | Cook et al. |
| 2001/0005667 A1 | 6/2001 | Tolles et al. |
| 2001/0024878 A1 | 9/2001 | Nakamura |
| 2001/0027018 A1 | 10/2001 | Molnar |
| 2001/0035354 A1 | 11/2001 | Ashjaee et al. |
| 2001/0036746 A1 | 11/2001 | Sato et al. |
| 2001/0040100 A1 | 11/2001 | Wang |
| 2001/0042690 A1 | 11/2001 | Talieh et al. |
| 2002/0008036 A1 | 1/2002 | Wang |
| 2002/0011417 A1 | 1/2002 | Talieh et al. |
| 2002/0020621 A1 | 2/2002 | Uzoh et al. |
| 2002/0025760 A1 | 2/2002 | Lee et al. |
| 2002/0025763 A1 | 2/2002 | Lee et al. |
| 2002/0070126 A1 | 6/2002 | Sato et al. |
| 2002/0077037 A1 | 6/2002 | Tietz |
| 2002/0088715 A1 | 7/2002 | Talieh et al. |
| 2002/0108861 A1 | 8/2002 | Emesh et al. |
| 2002/0119286 A1 | 8/2002 | Chen et al. |
| 2002/0123300 A1 | 9/2002 | Jones et al. |
| 2002/0130049 A1 | 9/2002 | Chen et al. |
| 2002/0130634 A1 | 9/2002 | Ziemkowski et al. |
| 2002/0146963 A1 * | 10/2002 | Teetzel ........................ 451/28 |
| 2002/0148732 A1 | 10/2002 | Emesh et al. |
| 2003/0034131 A1 | 2/2003 | Park et al. |
| 2003/0040188 A1 | 2/2003 | Hsu et al. |
| 2003/0114087 A1 | 6/2003 | Duboust et al. |
| 2003/0116445 A1 | 6/2003 | Lizhong |
| 2003/0116446 A1 | 6/2003 | Duboust et al. |
| 2003/0213703 A1 | 11/2003 | Wang |
| 2003/0220053 A1 | 11/2003 | Manens et al. |

FOREIGN PATENT DOCUMENTS

| | | |
|---|---|---|
| EP | 0 325753 | 8/1989 |
| EP | 0 455 455 | 11/1991 |
| EP | 0 455455 | 11/1991 |
| EP | 1 361 023 | 11/2003 |
| EP | 1 368826 | 12/2003 |
| JP | 58-171264 | 10/1983 |
| JP | 61-079666 | 4/1986 |
| JP | 61-265279 | 11/1986 |
| JP | 63-028512 | 2/1988 |
| JP | 05-277957 | 10/1993 |
| JP | 10-006213 | 1/1998 |
| JP | 11-042554 | 2/1999 |
| JP | 11-239961 | 7/1999 |
| JP | 2870537 | 11/1999 |
| JP | 2000-218513 | 8/2000 |
| JP | 01-77117 | 3/2001 |
| JP | 2001-77117 | 3/2001 |
| JP | 2001-179611 | 7/2001 |
| JP | 2001-244223 | 9/2001 |
| KR | 2003-037158 | 5/2003 |
| SU | 1618538 | 1/1991 |
| WO | WO 93/15879 | 8/1993 |
| WO | WO 98/49723 | 11/1998 |
| WO | WO 99/41434 | 8/1999 |
| WO | WO 99/53119 | 10/1999 |
| WO | WO 99/65072 | 12/1999 |
| WO | WO 00/03426 | 1/2000 |
| WO | WO 00/26443 | 5/2000 |
| WO | WO 00/33356 | 6/2000 |
| WO | WO 00/59682 | 10/2000 |
| WO | WO 01/13416 | 2/2001 |
| WO | WO 01/49452 | 7/2001 |
| WO | WO 01/52307 | 7/2001 |
| WO | WO 01/63018 | 8/2001 |
| WO | WO 01/71066 | 9/2001 |
| WO | WO 01/88229 | 11/2001 |
| WO | WO 01/88954 | 11/2001 |
| WO | WO 02/23616 | 3/2002 |
| WO | WO 02/064314 | 8/2002 |
| WO | WO 02/64314 | 8/2002 |
| WO | WO 02/075804 | 9/2002 |
| WO | WO 03/001581 | 1/2003 |

OTHER PUBLICATIONS

Partial International Search/PCT Invitation to Pay Additional Fees (PCT Article 17(3)(a) and Rule 40.1) dated Feb. 25, 2003 for Application No. PCT/US02/11009). (AMAT/4100EP02).

PCT Search Report dated Feb. 25, 2003 for PCT/US02/11009. (AMAT/4100EP02).

PCT Written Opinion for International Application US/02/11009 dated Apr. 10, 2002 (AMAT/4100EP02).

European Search Report for 03252801.0, dated Jan. 16, 2004 (AMAT/7047.EP).

Communication pursuant to Article 96(2) EPC for Application No. 02728965.4, dated Jun. 11, 2004 (AMAT/4100.EP02).

Partial International Search/PCT Invitation to pay additional fees dated Nov. 14, 2002 (4100 PC 02).

Notification regarding review of justification for invitation to pay additional fees for PCT/US/02/11009 (4100 PC 02) dated Feb. 25, 2003.

International Search Report for PCT/US 02/11009 (4100 EP 02) dated Feb. 25, 2003.

PCT Written Opinion dated Apr. 1, 2003 for PCT/US02/11009. (4100 EP 02).

Notification of Transmittal of International Preliminary Examination Report dated Nov. 10, 2003 (4100 EP 02).

European Search Report for 03252801.0, dated Jan. 16, 2004 (7047 EP).

Copy of Search Report issued by the Austrian Patent Office for corresponding Singapore Patent Application No. 200302562-4, provided by letter dated Oct. 7, 2004.

Invitation to pay additional fees dated Nov. 11, 2004 (4100 P5 PCT).

Notification of Tranmittal of International Preliminary Examination Report and Written Opinion dated Feb. 21, 2005 (4100 PCT).

Notification of transmittal of the International Search report and Written Opinion dated Mar. 14, 2005 (4100 P5 PCT).

PCT International Search Report and Written Opinion dated Apr. 28, 2005 for PCT/US04/037870. (AMAT/4100PC09).

Alexander, Jr., "Electrically Conductive Polymer Nanocomposite Materials", http://www.afrlhorizons.com/Briefs/Sept02/ML0206.html.

Contolini, "Electrochemical Planarization of ULSI Copper," Solid State Technology, vol. 40, No. 6, Jun. 1, 1997.

Nogami, "An Innovation to Integrate Porous Low-K Materials and Copper," InterConnect Japan 2001; Honeywell Seminar Dec. 6, 2001, p 1-12.

\* cited by examiner

TO POWER SOURCE

TO POWER
SOURCE

CONDUCTIVE POLISHING ARTICLE FOR ELECTROCHEMICAL MECHANICAL POLISHING

CROSS-REFERENCE TO RELATED APPLICATIONS

This application is a continuation of U.S. patent application Ser. No. 10/033,732, filed on Dec. 27, 2001, which application claims benefit of U.S. Provisional Patent Application Ser. No. 60/286,107, filed Apr. 24, 2001, and U.S. Provisional Patent Application Ser. No. 60/326,263, filed Oct. 1, 2001, and each application is incorporated herein by reference, and which U.S. patent application Ser. No. 10/033,732, filed on Dec. 27, 2001, is also a continuation-in-part of U.S. patent application Ser. No. 09/505,899, filed Feb. 17, 2000 now U.S. Pat. No. 6,537,144, entitled "Method and Apparatus for Enhanced CMP Using Metals Having Reductive Properties," and a continuation-in-part of U.S. patent application Ser. No. 10/026,854, filed Dec. 20, 2001, entitled "Articles for Polishing Semiconductor Substrates" which claims priority to U.S. Provisional Patent Application Ser. No. 60/258,162, filed on Dec. 22, 2000, entitled "Pad Perforation and Grooving to Help Chemical Distribution."

BACKGROUND OF THE INVENTION

1. Field of the Invention

The present invention relates to an article of manufacture and apparatus for planarizing a substrate surface.

2. Background of the Related Art

Sub-quarter micron multi-level metallization is one of the key technologies for the next generation of ultra large-scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

In the fabrication of integrated circuits and other electronic devices, multiple layers of conducting, semiconducting, and dielectric materials are deposited on or removed from a surface of a substrate. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electro-chemical plating (ECP). chemical vapor deposition (CVD), plasma-enhanced chemical vapor deposition (PECVD), and electrochemical plating (ECP).

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Chemical mechanical planarization, or chemical mechanical polishing (CMP), is a common technique used to planarize substrates. CMP utilizes a chemical composition, typically a slurry or other fluid medium, for selective removal of material from substrates. In conventional CMP techniques, a substrate carrier or polishing head is mounted on a carrier assembly and positioned in contact with a polishing pad in a CMP apparatus. The carrier assembly provides a controllable pressure to the substrate urging the substrate against the polishing pad. The pad is moved relative to the substrate by an external driving force. The CMP apparatus effects polishing or rubbing movement between the surface of the substrate and the polishing pad while dispersing a polishing composition to effect chemical activity and/or mechanical activity and consequential removal of material from the surface of the substrate One material increasingly utilized in integrated circuit fabrication is copper due to its desirable electrical properties. However, copper has its own special fabrication problems. For example, copper is difficult to pattern and etch and new processes and techniques, such as damascene or dual damascene processes, are being used to form copper substrate features. In damascene processes, a feature is defined in a dielectric material and subsequently filled with copper. Dielectric materials with low dielectric constants, i.e., less than about 3, are being used in the manufacture of copper damascenes. Barrier layer materials are deposited conformally on the surfaces of the features formed in the dielectric layer prior to deposition of copper material. Copper material is then deposited over the barrier layer and the surrounding field. However, copper fill of the features usually results in excess copper material, or overburden, on the substrate surface that must be removed to form a copper filled feature in the dielectric material and prepare the substrate surface for subsequent processing.

One challenge that is presented in polishing copper materials is that the interface between the conductive material and the barrier layer is generally non-planar and residual copper material is retained in irregularities formed by the non-planar interface. Further, the conductive material and the barrier materials are often removed from the substrate surface at different rates, both of which can result in excess conductive material being retained as residues on the substrate surface. Additionally, the substrate surface may have different surface topography, depending on the density or size of features formed therein. Copper material is removed at different removal rates along the different surface topography of the substrate surface, which makes effective removal of copper material from the substrate surface and final planarity of the substrate surface difficult to achieve.

One solution to remove all of the desired copper material from the substrate surface is to overpolish the substrate surface. However, overpolishing of some materials can result in the formation of topographical defects, such as concavities or depressions in features, referred to as dishing, or excessive removal of dielectric material, referred to as erosion. The topographical defects from dishing and erosion can further lead to non-uniform removal of additional materials, such as barrier layer materials disposed thereunder, and produce a substrate surface having a less than desirable polishing quality.

Another problem with the polishing of copper surfaces arises from the use of low dielectric constant (low k) dielectric materials to form copper damascenes in the substrate surface. Low k dielectric materials, such as carbon doped silicon oxides, may deform or fracture under conventional polishing pressures (i.e., about 6 psi), called down-force, which can detrimentally affect substrate polish quality and detrimentally affect device formation. For example, relative rotational movement between the substrate and a polishing pad can induce a shear force along the substrate surface and deform the low k material to form topographical defects, which can detrimentally affect subsequent polishing.

One solution for polishing copper in low dielectric materials with reduced or minimal defects formed thereon is by polishing copper by electrochemical mechanical polishing (ECMP) techniques. ECMP techniques remove conductive material from a substrate surface by electrochemical dissolution while concurrently polishing the substrate with reduced mechanical abrasion compared to conventional CMP processes. The electrochemical dissolution is performed by applying a bias between a cathode and substrate surface to remove conductive materials from a substrate surface into a surrounding electrolyte. In one embodiment of an ECMP system, the bias is applied by a ring of conductive contacts in electrical communication with the substrate surface in a substrate support device, such as a substrate carrier head. However, the contact ring has been observed to exhibit non-uniform distribution of current over the substrate surface, which results in non-uniform dissolution. Mechanical abrasion is performed by positioning the substrate in contact with conventional polishing pads and providing relative motion therebetween. However, conventional polishing pads often limit electrolyte flow to the surface of the substrate. Additionally, the polishing pad may be composed of insulative materials that may interfere with the application of bias to the substrate surface and result in non-uniform or variable dissolution of material from the substrate surface.

As a result, there is a need for an improved polishing article for the removal of conductive material on a substrate surface.

SUMMARY OF THE INVENTION

Aspects of the invention generally provide an article of manufacture and an apparatus for planarizing a layer on a substrate using electrochemical deposition techniques, electrochemical dissolution techniques, polishing techniques, and combinations thereof. In one aspect, an article of manufacture is provided for polishing a substrate including polishing article including a body having at least a partially conductive surface adapted to polish the substrate and a mounting surface. The polishing article may have a plurality of perforations formed therein to allow flow of fluid therethrough.

In another aspect, a polishing article is provided for polishing a substrate including a body having a polishing surface adapted to polish the substrate and at least one conductive element embedded in the polishing surface, the conductive element having a contact surface that extends beyond a plane defined by the polishing surface.

In another aspect, a polishing article is provided for polishing a substrate including a body having a polishing surface adapted to polish the substrate, at least one conductive element embedded in the polishing surface, and one or more pockets formed in the polishing surface, wherein the conductive element is disposed in at least one of the pockets.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and, therefore, are not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

The words and phrases used herein should be given their ordinary and customary meaning in the art by one skilled in the art unless otherwise further defined. Chemical-mechanical polishing should be broadly construed and includes, but is not limited to, abrading a substrate surface by chemical activity, mechanical activity, or a combination of both chemical and mechanical activity. Electropolishing should be broadly construed and includes, but is not limited to, planarizing a substrate by the application of electrochemical activity, such as by anodic dissolution. Electrochemical mechanical polishing (ECMP) should be broadly construed and includes, but is not limited to, planarizing a substrate by the application of electrochemical activity, mechanical activity, or a combination of both electrochemical and mechanical activity to remove material from a substrate surface. Electrochemical mechanical plating process (EC-MPP) should be broadly construed and includes, but is not limited to, electrochemically depositing material on a substrate and concurrently planarizing the deposited material by the application of electrochemical activity, mechanical activity, or a combination of both electrochemical and mechanical activity.

Anodic dissolution should be broadly construed and includes, but is not limited to, the application of an anodic bias to a substrate directly or indirectly which results in the removal of conductive material from a substrate surface and into a surrounding electrolyte solution. Perforation should be broadly construed and includes, but is not limited to, an aperture, hole, opening, channel, or passage formed partially or completely through an object, such as a polishing article.

Figure 1:
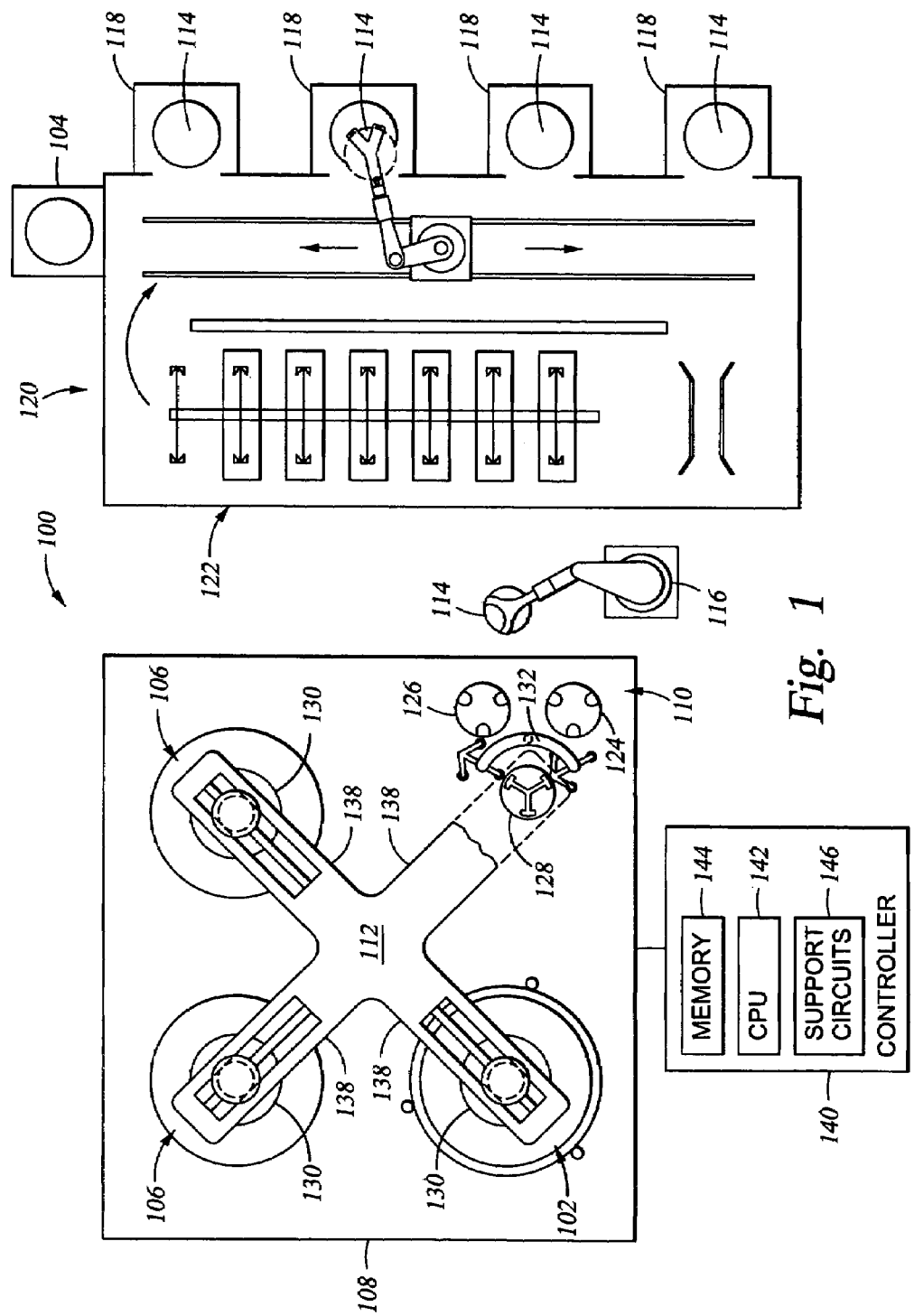
FIG. 1 is a plan view of one embodiment of a processing apparatus of the invention.

FIG. 1 depicts a processing apparatus 100 having at least one station suitable for electrochemical deposition and chemical mechanical polishing, such as electrochemical mechanical polishing (ECMP) station 102 and at least one conventional polishing or buffing station 106 disposed on a single platform or tool. One polishing tool that may be adapted to benefit from the invention is a MIRRA® chemical mechanical polisher available from Applied Materials, Inc. located in Santa Clara, Calif.

The exemplary apparatus 100 generally includes a base 108 that supports one or more ECMP stations 102, one or more polishing stations 106, a transfer station 110 and a carousel 112. The transfer station 110 generally facilitates transfer of substrates 114 to and from the apparatus 100 via a loading robot 116. The loading robot 116 typically transfers substrates 114 between the transfer station 110 and a factory interface 120 that may include a cleaning module 122, a metrology device 104 and one or more substrate storage cassettes 118. One example of a metrology device 104 is a NovaScan™ Integrated Thickness Monitoring system, available from Nova Measuring Instruments, Inc., located in Phoenix, Ariz.

Alternatively, the loading robot 116 (or factory interface 120) may transfer substrates to one or more other processing tools (not shown) such as a chemical vapor deposition tool, physical vapor deposition tool, etch tool and the like.

In one embodiment, the transfer station 110 comprises at least an input buffer station 124, an output buffer station 126, a transfer robot 132, and a load cup assembly 128. The loading robot 116 places the substrate 114 onto the input buffer station 124. The transfer robot 132 has two gripper assemblies, each having pneumatic gripper fingers that hold the substrate 114 by the substrate's edge. The transfer robot 132 lifts the substrate 114 from the input buffer station 124 and rotates the gripper and substrate 114 to position the substrate 114 over the load cup assembly 128, then places the substrate 114 down onto the load cup assembly 128.

The carousel 112 generally supports a plurality of polishing heads 130, each of which retains one substrate 114 during processing. The carousel 112 transfers the polishing heads 130 between the transfer station 110, the one or more ECMP stations 102 and the one or more polishing stations 106. One carousel 112 that may be adapted to benefit from the invention is generally described in U.S. Pat. No. 5,804,507, issued Sep. 8, 1998 to Tolles et al., which is hereby incorporated by reference to the extent it is not inconsistent with the claims and disclosure herein.

Generally, the carousel 112 is centrally disposed on the base 108. The carousel 112 typically includes a plurality of arms 138. Each arm 138 generally supports one of the polishing heads 130. One of the arms 138 depicted in FIG. 1 is not shown so that the transfer station 110 may be seen. The carousel 112 is indexable such that the polishing head 130 may be moved between the stations 102, 106 and the transfer station 110 in a sequence defined by the user.

Generally the polishing head 130 retains the substrate 114 while the substrate 114 is disposed in the ECMP station 102 or polishing station 106. The arrangement of the ECMP stations 106 and polishing stations 102 on the apparatus 100 allow for the substrate 114 to be sequentially plated or polished by moving the substrate between stations while being retained in the same polishing head 130. One polishing head that may be adapted to be used in the invention is a TITAN HEAD™ substrate carrier, manufactured by Applied Materials, Inc., located in Santa Clara, Calif.

Examples of embodiments of polishing heads 130 that may be used with the polishing apparatus 100 described herein are described in U.S. Pat. No. 6,024,630, issued Feb. 25, 2000 to Shendon, et al., which is hereby incorporated by reference to the extent it is not inconsistent with the claims and disclosure herein.

To facilitate control of the polishing apparatus 100 and processes performed thereon, a controller 140 comprising a central processing unit (CPU) 142, memory 144, and support circuits 146, is connected to the polishing apparatus 100. The CPU 142 may be one of any form of computer processor that can be used in an industrial setting for controlling various drives and pressures. The memory 144 is connected to the CPU 142. The memory 144, or computer-readable medium, may be one or more of readily available memory such as random access memory (RAM), read only memory (ROM), floppy disk, hard disk, or any other form of digital storage, local or remote. The support circuits 146 are connected to the CPU 142 for supporting the processor in a conventional manner. These circuits include cache, power supplies, clock circuits, input/output circuitry, subsystems, and the like.

Figure 2:
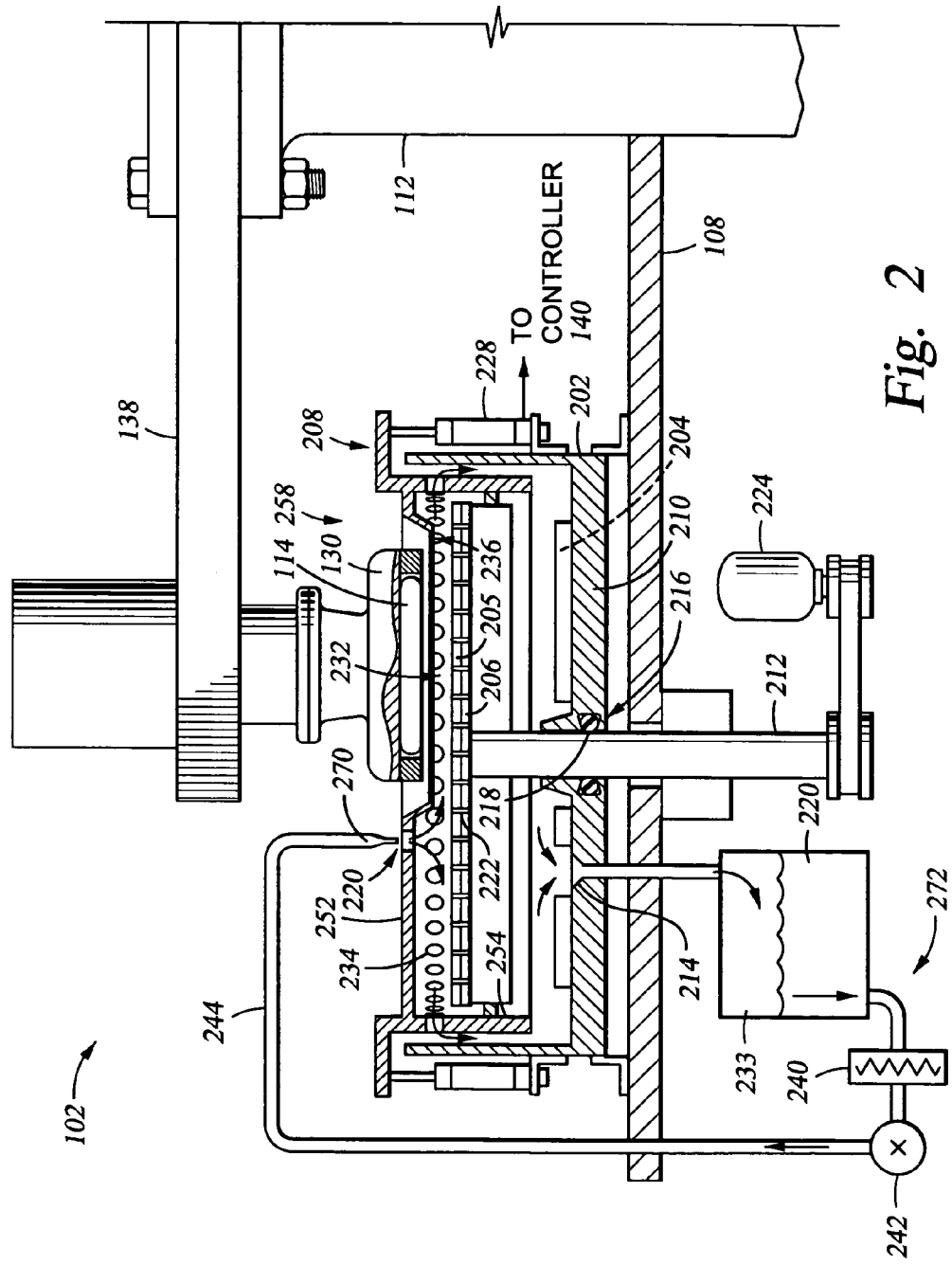
FIG. 2 is a sectional view of one embodiment of an ECMP station.

FIG. 2 depicts a sectional view of the polishing head 130 supported above an ECMP station 102. The ECMP station 102 generally includes a basin 202, an electrode 204, polishing article 205, a disc 206 and a cover 208. In one embodiment, the basin 202 is coupled to the base 108 of the polishing apparatus 100. The basin 202 generally defines a container or electrolyte cell in which a conductive fluid such as an electrolyte 220 can be confined. The electrolyte 220 used in processing the substrate 114 can include metals such as copper, aluminum, tungsten, gold, silver or other materials which can be electrochemically deposited onto or electrochemically removed from the substrate 114.

The basin 202 can be a bowl shaped member made of a plastic such as fluoropolymers, TEFLON®, PFA, PE, PES, or other materials that are compatible with electroplating and electropolishing chemistries. The basin 202 has a bottom 210 that includes an aperture 216 and a drain 214. The aperture 216 is generally disposed in the center of the bottom 210 and allows a shaft 212 to pass therethrough. A seal 218 is disposed between the aperture 216 and the shaft 212 and allows the shaft 212 to rotate while preventing fluids disposed in the basin 202 from passing through the aperture 216.

The basin 202 typically includes the electrode 204, the disc 206, and the polishing article 205 disposed therein. Polishing article 205, such as a polishing pad, is disposed and supported in the basin 202 on the disc 206.

The electrode 204 is a counter-electrode to the substrate 114 and/or polishing article 205 contacting a substrate surface. The polishing article 205 is at least partially conductive and may act as an electrode in combination with the substrate during electrochemical processes, such as an electrochemical mechanical plating process (ECMPP), which includes electrochemical deposition and chemical mechanical polishing, or electrochemical dissolution. The electrode 204 may be an anode or cathode depending upon the positive bias (anode) or negative bias (cathode) applied between the electrode 204 and polishing article 405.

For example, depositing material from an electrolyte on the substrate surface, the electrode 204 acts as an anode and the substrate surface and/or polishing article 205 acts as a cathode. When removing material from a substrate surface, such as by dissolution from an applied bias, the electrode 204 functions as a cathode and the substrate surface and/or polishing article 205 may act as an anode for the dissolution process.

The electrode 204 is generally positioned between the disc 206 and the bottom 210 of the basin 202 where it may be immersed in the electrolyte 220. The electrode 204 can be a plate-like member, a plate having multiple apertures formed therethrough, or a plurality of electrode pieces disposed in a permeable membrane or container. A permeable membrane (not shown) may be disposed between the disc 206 and the electrode 204 or electrode 204 and polishing article 205 to filter bubbles, such as hydrogen bubbles, form the wafer surface and to reduce defect formation and stabilize or more uniformly apply current or power therebetween.

The electrode 204 is comprised of the material to be deposited or removed, such as copper, aluminum, gold, silver, tungsten and other materials which can be electrochemically deposited on the substrate 114. For electrochemical removal processes, such as anodic dissolution, the electrode 204 may include a non-consumable electrode of a material other than the deposited material, such as platinum for copper dissolution. The non-consumable electrode is used in planarization processes combining both electrochemical deposition and removal.

While the following polishing article is described for an electrochemical-mechanical polishing (ECMP) process, the invention contemplates using the conductive polishing article in other fabrication processes involving electrochemical activity. Examples of such processes using electrochemical activity include electrochemical deposition, which involves the polishing article 205 being used to apply a uniform bias to a substrate surface for depositing a conductive material without the use of conventional bias application apparatus, such as edge contacts, and electrochemical mechanical plating processes (ECMPP) that include a combination of electrochemical deposition and chemical mechanical polishing.

The polishing article 205 can be a pad, a web or a belt of material, which is compatible with the fluid environment and the processing specifications. In the embodiment depicted in FIG. 2, the polishing article 205 is circular in form and positioned at an upper end of the basin 202, supported on its lower surface by the disc 206. The polishing article 205 includes at least a partially conductive surface of a conductive material, such as one or more conductive elements, for contact with the substrate surface during processing. The polishing article 205 may be a conductive polishing material or a composite of a conductive polishing material disposed on a conventional polishing material. For example the conductive material may be disposed on a "backing" material disposed between the disc 206 and polishing article 205 to tailor the compliance and/or durometer of the polishing article 205 during processing.

The basin 202, the cover 208, and the disc 206 may be movably disposed on the base 108. The basin 202, cover 208 and disc 206 may be axially moved toward the base 108 to facilitate clearance of the polishing head 130 as the carousel 112 indexes the substrate 114 between the ECMP and polishing stations 102, 106. The disc 206 is disposed in the basin 202 and coupled to the shaft 212. The shaft 212 is generally coupled to a motor 224 disposed below the base 108. The motor 224, in response to a signal from the controller 140, rotates the disc 206 at a predetermined rate.

The disc 206 may be a perforated article support made from a material compatible with the electrolyte 220 which would not detrimentally affect polishing. The disc 206 may be fabricated from a polymer, for example fluoropolymers, PE, TEFLON®, PFA, PES, HDPE, UHMW or the like. The disc 206 can be secured in the basin 202 using fasteners such as screws or other means such as snap or interference fit with the enclosure, being suspended therein and the like. The disc 206 is preferably spaced from the electrode 204 to provide a wider process window, thus reducing the sensitivity of depositing material and removing material from the substrate surface to the electrode 204 dimensions.

The disc 206 is generally permeable to the electrolyte 220. In one embodiment, the disc 206 includes a plurality of perforations or channels 222 formed therein. The perforation size and density is selected to provide uniform distribution of the electrolyte 220 through the disc 206 to the substrate 114. In one aspect of the disc 206 includes perforations having a diameter between about 0.02 inches (0.5 millimeters) and about 0.4 inches (10 mm). The perforations may have a perforation density between about 30% and about 80% of the polishing article. A perforation density of about 50% has been observed to provide electrolyte flow with minimal detrimental effects to polishing processes. Generally, the perforations of the disc 206 and the polishing article 205 are aligned to provide to provide for sufficient mass flow of electrolyte through the disc 206 and polishing article 205 to the substrate surface. The polishing article 205 may be disposed on the disc 206 by a mechanical clamp or conductive adhesive.

The electrolyte 220 is prevented from overflowing the processing area 232 by a plurality of apertures 234 disposed in a skirt 254. The apertures 234 generally provide a path through the cover 208 for the electrolyte 220 exiting the processing area 232 and flowing into the lower portion of the basin 202. The apertures 234 are generally positioned between a lower surface 236 of the depression 258 and the center portion 252. As at least a portion of the apertures 234 are typically higher than the surface of the substrate 114 in a processing position, the electrolyte 220 fills the processing area 232 and is thus brought into contact with the substrate 114 and polishing article 205. Thus, the substrate 114 maintains contact with the electrolyte 220 through the complete range of relative spacing between the cover 208 and the disc 206.

The electrolyte 220 collected in the basin 202 generally flows through the drain 214 disposed at the bottom 210 into the fluid delivery system 272. The fluid delivery system 272 typically includes a reservoir 233 and a pump 242. The electrolyte 220 flowing into the fluid delivery system 272 is collected in the reservoir 233. The pump 242 transfers the electrolyte 220 from the reservoir 233 through a supply line 244 to the nozzle 270 where the electrolyte 220 recycled through the ECMP station 102. A filter 240 is generally disposed between the reservoir 233 and the nozzle 270 to remove particles and agglomerated material that may be present in the electrolyte 220.

Polishing Article Structures

In one aspect, the polishing article 205 is composed of a single layer of conductive polishing material described herein disposed on the disc 206. In another aspects, the polishing article 205 may comprises a plurality of material layers including at least one conductive material on the substrate surface or providing for a conductive surface for contacting a substrate.

Figure 3:
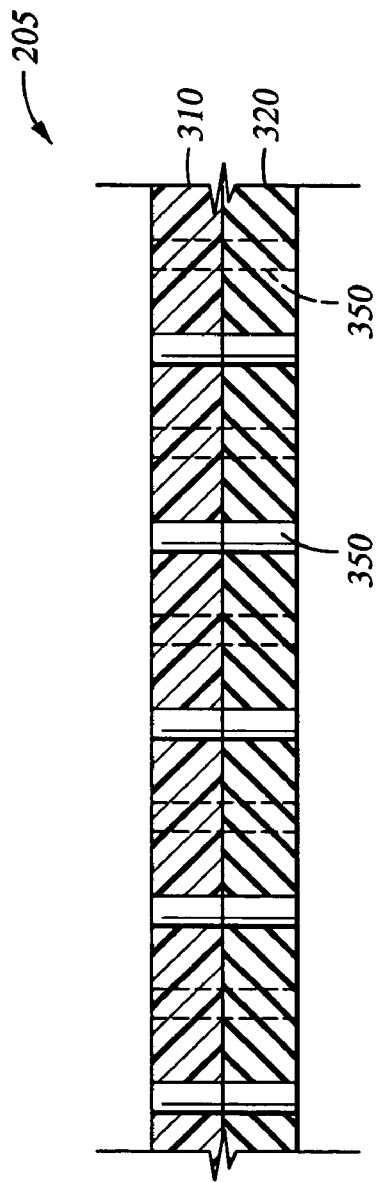
FIG. 3 is a side schematic view of one embodiment of the polishing article.

FIG. 3 is a cross section view of the polishing article 205 illustrating a multi-layer or composite layer polishing article having a conductive polishing portion 310 for polishing a substrate surface and a mounting portion 320. The conductive polishing portion 310 may include a conductive polishing material or be a composite of the conductive polishing material and the conventional polishing material described herein. The thickness of the polishing article 205 may be between about 0.1 mm and about 5 mm.

The mounting portion 320 generally comprises the same material as the conductive polishing portion 310. However, the mounting portion 320 may be formed of other materials, such as formed only from a conventional hard polishing material, i.e., a shore D hardness of about 80 or greater, which provides support to the conductive polishing portion 310 during polishing. Additionally, the mounting portion 320 may be a conventional soft material, such as compressed felt fibers leached with urethane, for absorbing some of the pressure applied between the polishing article 205 and the carrier head 130. The soft material may have a Shore D hardness between about 25 and about 40.

Generally, the conductive polishing portion 310 is adhered to the mounting portion 320 by a conventional adhesive. The adhesive may be conductive or dielectric depending on the requirements of the process. The mounting portion 320 may be affixed to the disc 206 by an adhesive or mechanical clamps.

The conductive polishing portion 310 and the mounting portion 320 of the polishing article 205 are generally permeable to the electrolyte by a plurality of perforations or channels formed therein. The plurality of perforations or channels allows electrolyte to flow through and contact the surface during processing. Perforations 350 formed in the polishing article 205 may include channels or apertures in the polishing article having a diameter between about 0.02 inches (0.5 millimeters) and about 0.4 inches (10 mm). While not shown in FIG. 3, the perforations may have a diameter about equal to the thickness of the polishing article 205, or an aspect ratio of about 1:1 between the thickness of the polishing article 205 and the diameter of the perforations disposed therein.

The polishing article may have a perforation density between about 30% and about 80% of the polishing article to provide for sufficient mass flow of electrolyte across the polishing article surface. In one embodiment, a perforation density of about 50% provides sufficient electrolyte flow to facilitate uniform anodic dissolution from the substrate surface. Perforation density is broadly described herein as the area or volume of polishing article that the perforations comprise, i.e., the aggregate number and diameter or size of the perforations, of the surface or body of the polishing article when perforations are formed in the polishing article 205.

The perforation size and density is selected to provide uniform distribution of electrolyte through the polishing article 205 to a substrate surface. Generally, the perforation size, perforation density, and organization of the perforations of both the conductive polishing portion 310 and the mounting portion 320 are configured and aligned to each another to provide for sufficient mass flow of electrolyte through the conductive polishing portion 310 and the mounting portion 320 to the substrate surface.

Figure 4:
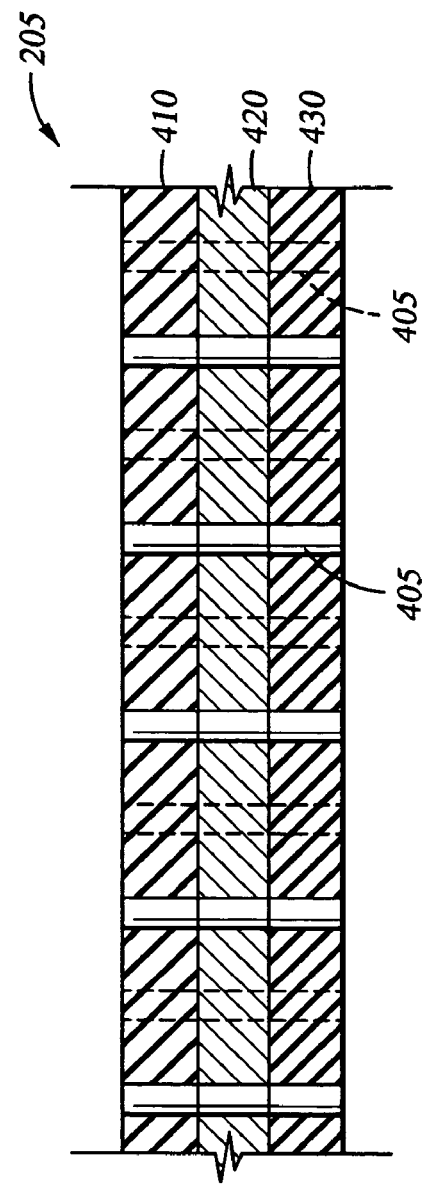
FIGS. 4 is a side schematic view of another embodiment of the polishing article.

Referring to FIG. 4, in one aspect, the polishing article 205 includes conductive polishing surface article 410 for polishing a substrate surface, a conductive article support layer 420, and a rigid support layer 430. Generally, the conductive polishing surface article 410 is disposed on the conductive article support layer 420 and is adhered to the conductive article support layer 420 by a conductive adhesive. The conductive article support layer 420 may be affixed to the rigid support layer 430 by a conventional adhesive used with polishing materials and in polishing processes. The rigid support layer 430 may comprise a mounting portion 440 to be disposed on a article support structure, such as the disc 206, or may comprise the disc 206 itself. The polishing article 205 may be affixed to the disc 206 by an adhesive or mechanical clamps (not shown). The thickness of the polishing article 205 is between about 0.1 mm and about 5 mm in thickness.

The conductive polishing surface article 410 may comprise a conductive polishing material or composite of a conductive polishing material disposed in conventional polishing materials as described herein. The conductive polishing surface article 410 generally includes a surface roughness of about 1 micron or less. The conductive polishing surface article 410 generally has a hardness of about 50 or greater on the Shore D Hardness scale for polymeric materials.

The conductive article support layer 420 may be made from a conductive material compatible with surrounding electrolyte which would not detrimentally affect polishing. The conductive article support layer 420 can be made of materials including conductive noble metals, such as platinum, or a conductive polymer to provide electrical conduction across the polishing article. Suitable materials for the conductive article support layer 420 are those which are inert materials in the polishing process and are resistant to being consumed or damaged during ECMP.

However, the invention contemplates the use of materials for the conductive article support layer 420 that are reactive with the surrounding electrolyte, such as copper, if such materials are isolated from the surrounding electrolyte. For example, the conductive article support layer 420 may be conformally covered with the conductive polishing material to minimize any detrimental impact of reactivity between the material of the conductive article support layer 420 and surrounding electrolyte.

The conductive article support layer 420 generally has a better conductivity, i.e., lower resistivity, than does the conductive polishing surface article 410. For example, the conductive article support may comprise platinum, which has a resistivity 9.81 $\mu\Omega$-cm at 0° C., and is a lower resistivity than carbon fibers or carbon nanotubes, both of which exhibit resistivities of 1.0 $\Omega$-cm or less. The conductive article support layer 420 is used to provide for uniform bias or current to minimize conductive resistance along the surface of the article, for example, the radius of the article, during polishing for uniform anodic dissolution across the substrate surface.

The conductive article support layer 420 is connected to a power source (not shown). The conductive article support layer 420 provides the current carrying capability, i.e., the anodic bias for anodic dissolution, of the conductive polishing article 205. The power source may be connected to the conductive article support layer 420 by one or more conductive contacts disposed around the conductive article support layer 420. One or more power sources may be connected to the conductive article support layer 420 by the one or more contacts to allow for generating variable bias or current across portion of the substrate surface.

The rigid support layer 430 generally comprises a rigid support material used to hold polishing article. Rigid support layer 430 may include polymeric materials, for example fluoropolymers, PE, TEFLON®, PFA, PES, HDPE, UHMW or the like used for the disc 206. Additionally, the rigid support layer 430 may include a conventional hard polishing material, for example, materials found in the IC series of polishing article, such as polyurethane or polyurethane composites, including the IC-1000 polishing pad, from Rodel Inc., of Phoenix, Ariz. Generally, when using a hard conventional material for the rigid support layer 430, the hard conventional material has a hardness less than that of the conductive polishing surface article 410.

Alternatively, a layer of compressible material, such as soft polishing material may be disposed in place of the rigid support layer 430 or between the conductive article support layer 420 and rigid support layer 430. The compressible material includes a conventional soft material, such as compressed felt fibers leached with urethane, and having a Shore D hardness between about 25 and about 40.

The conductive polishing surface article 410, the conductive article support layer 420, and the rigid support layer 430 of the polishing article 205 are generally made permeable to the electrolyte by a plurality of perforations or channels formed therein. The perforations 405 include channels or apertures in the polishing article having a diameter between about 0.02 inches (0.5 millimeters) and about 0.4 inches (10 mm) and a perforation density may be between about 30% and about 80% of the polishing article 205. A perforation density of about 50% may be used with the polishing article 205. While not shown in FIG. 4, the perforations 405 may have a diameter about equal to the thickness of the polishing article 205, or an aspect ratio of about 1:1 between the thickness of the polishing article 205 and the diameter of the perforations disposed therein.

Generally the perforation size, organization, and density of the conductive polishing surface article 410, the conductive article support layer 420, and the rigid support layer 430 are configured and aligned to provide for sufficient mass flow of electrolyte through rigid support layer 430, the conductive article support layer 420, and the conductive polishing surface article 410 to the substrate surface.

In one embodiment, the rigid support 430 includes a surface for mounting on disc 206. The disc 206 may be perforated. The rigid support 430 may be secured to the disc 206 by mechanical clamps or a conventional adhesion for securing polishing materials to support structures. Generally, the perforations of the disc 206 are configured and aligned with the rigid support 430, the conductive article support layer 420, and the conductive polishing surface article 410 to provide for sufficient mass flow of electrolyte through the polishing article 205 and the disc 206 to the substrate surface.

Figure 5A:
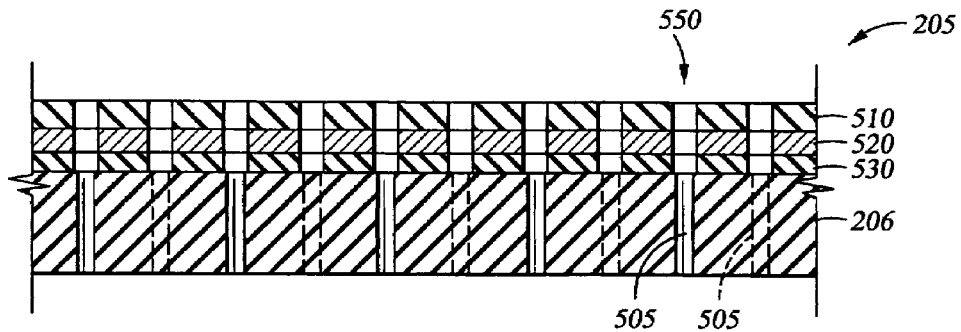
FIGS. 5A–5B are side schematic views of another embodiment of the polishing article.

FIG. 5A is a side schematic view of another embodiment of the polishing article 205 disposed on the disc 206. The polishing article 205 in this embodiment includes a round polishing pad including conductive polishing surface article 510 disposed on a article support layer 520, which is disposed on a support layer 530. The conductive polishing surface article 510 includes carbon fibers and polyurethane, the article support layer 520 includes a platinum film, and the support 530 typically includes a compressible material, such as a soft material described herein, including compressed felt fibers leached with urethane. A less compressible material, such as a hard material described herein, for example, polyurethane, may be used as the support layer 530. Grooves 550 are formed in the conductive polishing surface article 510, the conductive article support layer 520, and the rigid support 530 of the polishing article 205, and perforations 505 are formed in the disc 206 to further allow electrolyte to contact the substrate surface during ECMP.

Figure 5B:
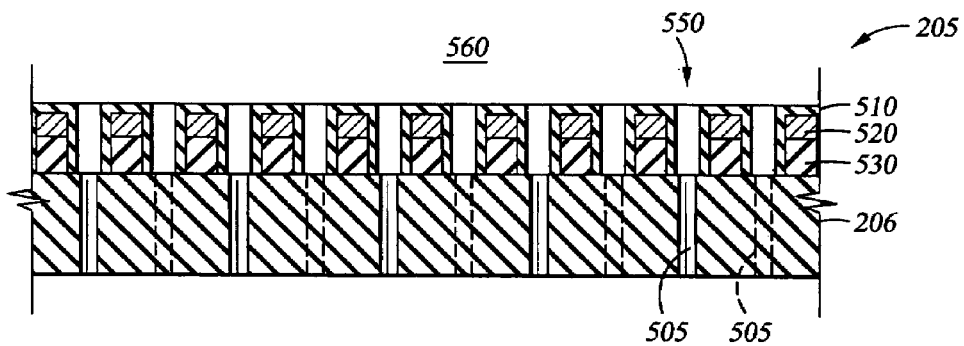

FIG. 5B is a side schematic view of another embodiment of the polishing article 205 disposed on disc 206. In this embodiment, the conductive article support layer 520 layer is isolated from the surrounding electrolyte 560 by a conformal layer of the conductive polishing surface article 510. The conductive polishing surface article 510 is provided at a thickness of about 1 mm and covers the entire exposed conductive article support layer 520. Since the conductive article support layer 520 is not exposed to the surrounding electrolyte, the conductive layer 520 may include materials, such as copper which has a resistivity of 1.6 $\mu\Omega$-cm at 0° C., that may be consumed if exposed to ECMP processing.

While not shown in FIGS. 5A and 5B, the perforations 505 may have a diameter about equal to the thickness of the polishing article 205 or an aspect ratio of about 1:1 between the thickness of the polishing article 205 and the diameter of the perforations disposed therein.

Figure 6:
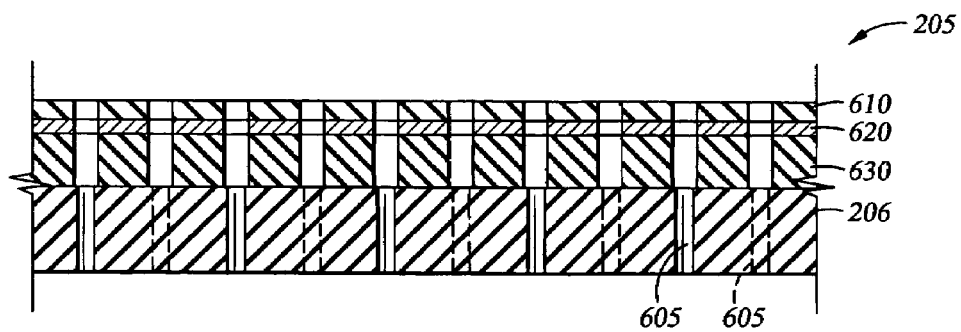
FIG. 6 is a side schematic view of another embodiment of the polishing article.

FIG. 6 is a side schematic view of another embodiment of the polishing article 205 disposed on the disc 206. A metal mesh 610 of a conductive metal is disposed in the polishing article 205 to provide conductivity to the polishing article 205. In one embodiment, the polishing article 205 using a metal mesh generally comprise a stack of polishing materials including metal mesh 610 disposed in a first conventional polishing material, a flexible polishing material 620, and rigid support 630 of a second conventional polishing material. The metal mesh 610 disposed in the first conventional polishing material includes the conductive polishing portion of the polishing article 205 and the flexible polishing material 620 and rigid support 630 comprise the mounting portion of the polishing article 205.

The amount, thickness, material, and configuration of the metal mesh and the thickness of the conventional polishing material are designed to provide a bias or current to the substrate surface with minimal resistance between an external power source and the polishing article surface. For example, the metal mesh may be interwoven wire forming a "X-Y" grid (a square pattern) or a triangular pattern, an "X-Y" grid with diagonal wires passing therethrough, formed in the conventional polishing material.

The metal mesh includes conductive materials, such as platinum described herein, which is chemically inert to the surrounding electrolyte. Additionally, conformal coverage of the metal mesh by the conventional or conductive polishing material may allow the use of materials, such as copper which has a resistivity of 1.6 $\mu\Omega$-cm at 0° C., that may be consumed if exposed to ECMP processing.

The conductive polishing article 610 with the metal mesh may be manufactured by forming a pattern in the first conventional polishing material and then electroplating or pressing a metal mesh in the pattern. The conductive polishing article 610 may also be manufactured to be conformally covered by the conventional polishing material by disposing the metal mesh in an injection molding apparatus and then forming the conventional polishing material around the mesh by an injection molding process. Grooves 650 and perforations 605 may also formed in the polishing article 205 with the metal mesh for effective flow of electrolyte across the polishing article 205. The metal mesh is generally formed in the conductive polishing article 610 with exposed contacts for connecting to a power source.

The conventional polishing material used with the metal mesh 610 and the conventional polishing material of the rigid support 630 may be the same or different conventional material. The conventional polishing material used with the metal mesh 610 and the conventional polishing material of the rigid support 630 may have the same or different hardness. For example, a first conventional polishing material may be used with the metal mesh 610 may have a Shore D hardness between about 50 and about 60, and the rigid support 630 may be formed by a second conventional polishing material having a hardness of about 80. Conductive materials, such as conductive polymers and conductive filler material, may also be used with the metal mesh 610.

The flexible polishing material 620 may comprise a uniformly compressible plastic, foam or rubber. An example of a flexible polishing material is compressed felt fibers leached with urethane. One polishing article material suitable for use as the flexible polishing material 620 includes the materials used in the Politex or Suba IV polishing article from Rodel, Inc. of Phoenix, Ariz. (Politex and Suba IV are product names of Rodel, Inc.). The flexible polishing material may have a Shore D hardness between about 25 and about 40.

Referring back to FIGS. 5A, 5B, and 6, grooves may be disposed in the polishing article 205 to promote electrolyte flow to the substrate surface for anodic dissolution or electroplating processes. While the grooves shown in FIGS. 5A, 5B, and 6, illustrate grooves through multiple layers, the invention contemplates grooves being formed in the upper layer or polishing surface that contacts the substrate surface with perforations in the non-grooved layer to provide electrolyte flow therethrough.

Examples of grooves used to facilitate electrolyte flow include linear grooves, arcuate grooves, annular concentric grooves, and helical grooves among others. The grooves formed in the article 205 may have a cross-section that is square, circular, semi-circular, or any other shape conventionally used in the art. The grooves may be configured into patterns, such as an X-Y pattern disposed on the polishing surface or a triangular pattern formed on the polishing surface, or combinations thereof, to improve electrolyte flow over the surface of the substrate. Any suitable groove configuration, size, diameter, and spacing may be used to provide the desired flow of electrolyte. In one aspect of the polishing article, the grooves are configured to intersect with the perforations formed in the polishing article.

Figure 7:
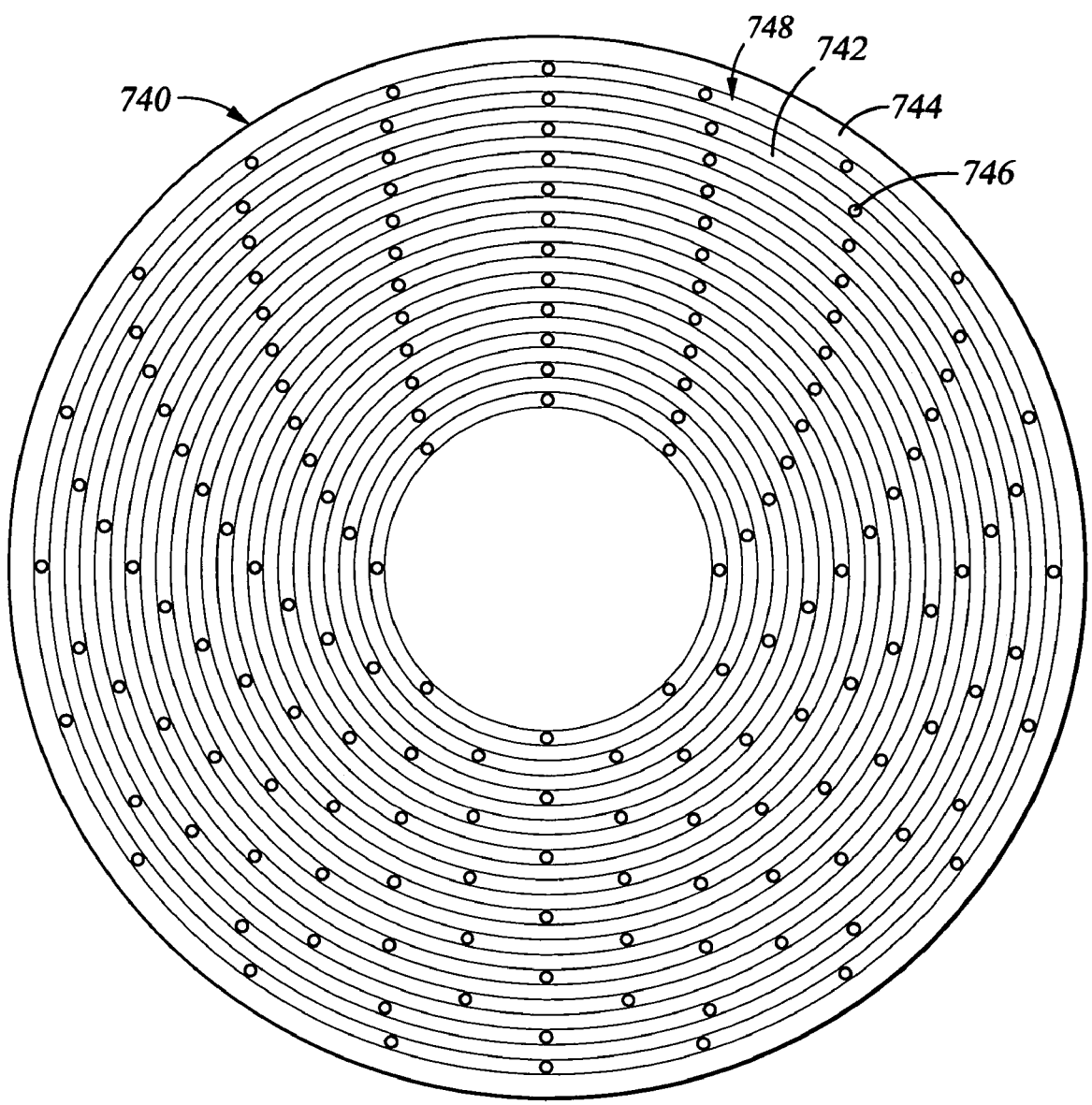
FIG. 7 is a top plan view of one embodiment of a grooved polishing article.

FIG. 7 is a top plan view of one embodiment of a grooved polishing article. A round pad 740 of the polishing article 205 is shown having a plurality of perforations 746 of a sufficient size and organization to allow the flow of electrolyte to the substrate surface. The perforations 746 can be spaced between about 0.2 inches and about 1.0 inches from one another. The perforations may be circular perforations having a diameter of between about 0.02 inches (0.5millimeters) and about 0.4 inches (10 mm). Further the number and shape of the perforations may vary depending upon the apparatus, processing parameters, and ECMP compositions being used.

Grooves 742 are formed in the polishing surface 748 of the polishing article 205 therein to assist transport of fresh electrolyte from the bulk solution from basin 202 to the gap between the substrate and the polishing article. The grooves 742 may be spaced between about 30 mils and about 300 mils apart from one another. Generally, grooves 742 formed in the polishing article have a width between about 5 mils and about 30 mils, but may vary in size as required for polishing. An example of a groove pattern includes grooves of about 10 mils wide spaced about 60 mils apart from one another. Transport of electrolyte may be enhanced by forming the perforations at least partially in the grooves to improve flow of the electrolyte.

Figure 8:
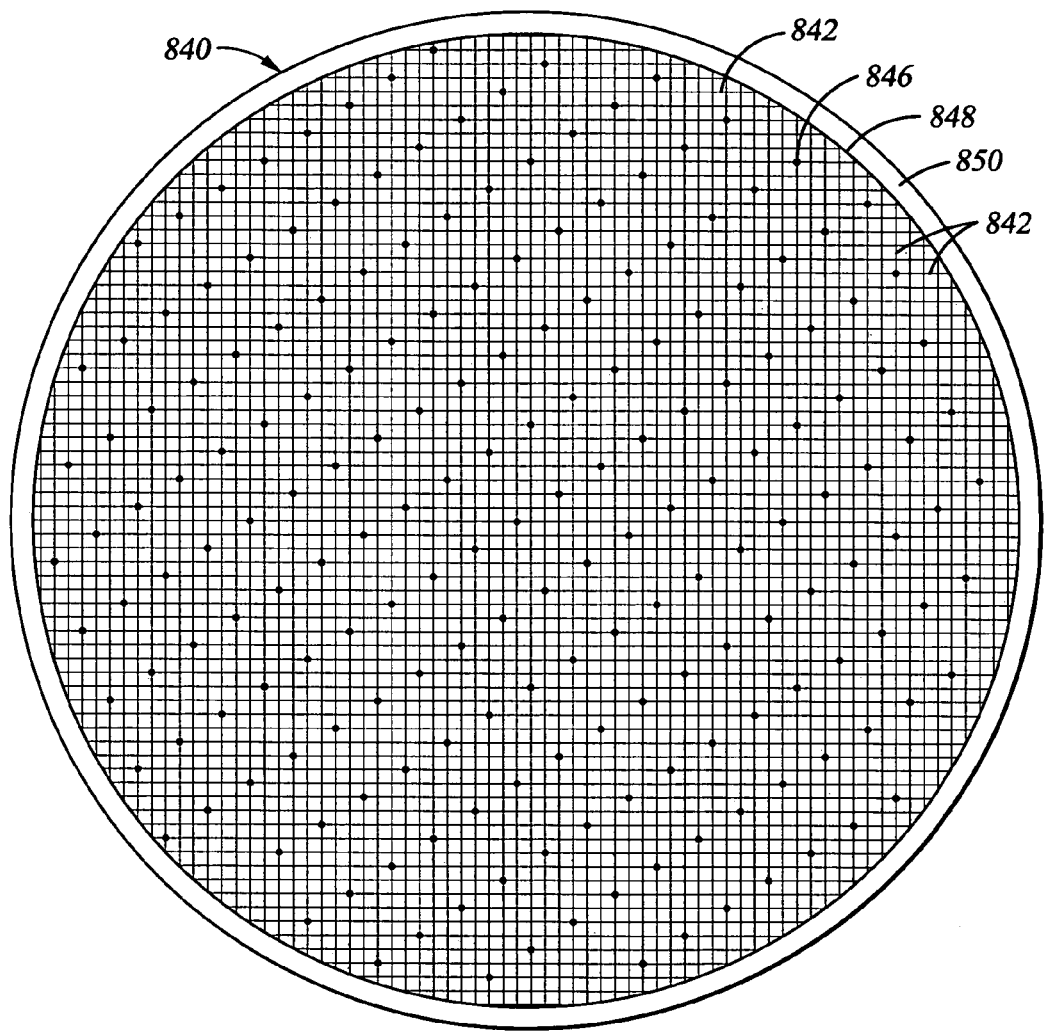
FIG. 8 is a top plan view of another embodiment of a grooved polishing article.
Figure 9:
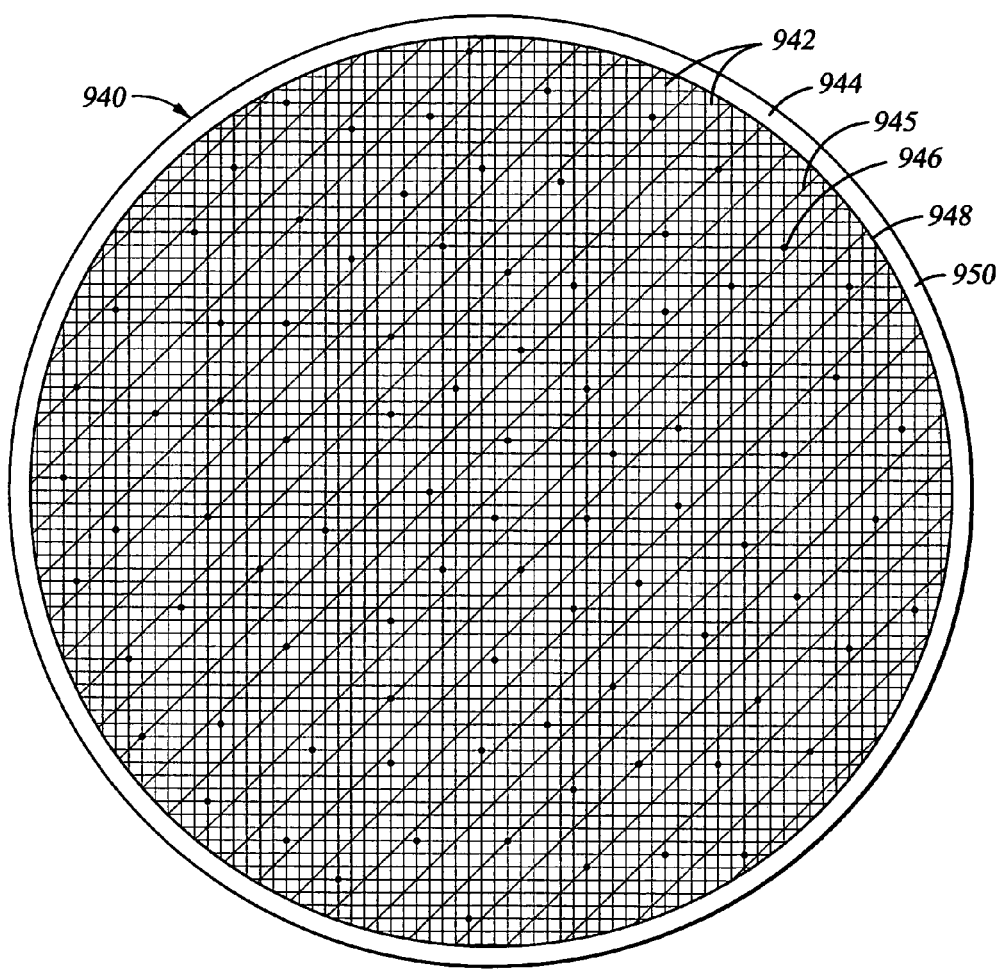
FIG. 9 is a top plan view of another embodiment of a grooved polishing article.

The grooves 742 may have various patterns, including a groove pattern of substantially circular concentric grooves on the polishing surface 748 as shown in FIG. 7, an X-Y pattern as shown in FIG. 8 and a triangular pattern as shown in FIG. 9. While these patterns are shown and described herein, the invention contemplates the use of other patterns which can facilitate electrolyte flow to a substrate surface during processing.

FIG. 8 is a top plan view of another embodiment of a polishing pad having grooves 842 disposed in an X-Y pattern on the polishing article 848 of a polishing pad 840. Perforations 846 may be disposed at the intersections of the vertically and horizontally disposed grooves, and may also be disposed on a vertical groove, a horizontal groove, or disposed in the polishing article 848 outside of the grooves 842. The perforations 846 and grooves 842 are disposed in the inner diameter 850 of the polishing article and the outer diameter 850 of the polishing pad 844 may be free of perforations and grooves and perforations.

FIG. 9 is another embodiment of patterned polishing article 948. In this embodiment, grooves 942 may be disposed in an X-Y pattern with diagonally disposed grooves 945 intersecting the X-Y patterned grooves 942. The diagonal grooves 945 may be disposed at an angle between about 30° and about 60° from any of the X-Y grooves 942. Perforations 946 may be disposed at the intersections of the X-Y grooves 942, the intersections of the X-Y grooves 942 and diagonal grooves 945, along any of the grooves 942 and 945, or disposed in the polishing article 948 outside of the grooves 942 and 945. The perforations 946 and grooves 942 are disposed in the inner diameter 950 of the polishing article and the outer diameter 950 of the polishing pad 944 may be free of perforations and grooves.

It is believed that the grooves provide a supply of electrolyte to the substrate surface that is evenly distributed on the substrate surface allowing for a more even dissolution of material into the substrate, and thereby increasing substrate planarity and uniformity. It is further believed that the use of intersecting grooves and perforations will allow electrolyte to enter through one set of perforation, be evenly distributed around the substrate surface, and then removed through a second set of perforations.

Conductive Elements in Polishing Articles

The conductive polishing article 205 of the invention may alternatively comprise discrete conductive elements disposed in a polishing material. While not shown, the following polishing article descriptions may include polishing articles having perforation and grooving patterns described herein and shown in FIGS. 7–9, with configurations to the patterns to incorporate the conductive elements described herein as follows.

Figure 10A:
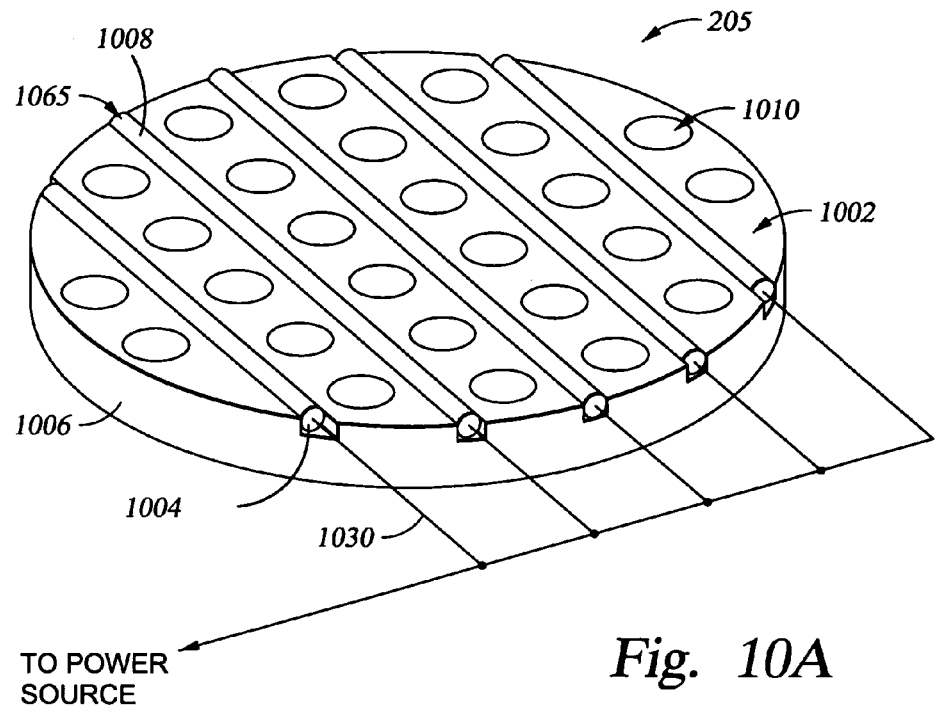
FIG. 10A is perspective view of one embodiment of a polishing article having a conductive element.

FIG. 10A depicts one embodiment of a polishing article 205 having conductive elements disposed therein. The polishing article 205 generally comprises a body 1006 having a polishing surface 1002 adapted to contact the substrate while processing. The polishing surface 1002 has one or more opening or pockets 1004 formed therein to at least partially receive the conductive elements 1065. The conductive elements 1065 are generally disposed to have a contact surface 1008 with a substrate that extends above a plane defined by the polishing surface 1002. The contact surface 1008 is typically configured, such as by having a compliant, flexible, or pressure moldable surface, to maximize electrical contact of the conductive elements 1065 when contacting the substrate. During polishing, a bias force that urges the contact surface 1008 into a position co-planar with the polishing surface 1002.

The body 1006 is generally made permeable to the electrolyte by a plurality of perforations 1010 formed therein as described herein. The polishing article 205 may have an aperture density between about 30% and about 80% of the surface area of the polishing article 205 to provide for sufficient mass flow of electrolyte across the polishing surface 1002. In one embodiment, an aperture density of about 50% provides sufficient electrolyte flow to facilitate uniform anodic dissolution from the substrate surface.

The body 1006 generally comprises a dielectric material such as the conventional materials described herein. The pockets 1004 formed in the body 1006 are generally configured to retain the conductive elements 1065 while processing, and accordingly may vary in shape and orientation. In the embodiment depicted in FIG. 10A, the pockets 1004 are grooves of rectangular cross section and are disposed across the polishing surface 1002 coupling two points on the perimeter of the polishing article 205. Alternatively, the pockets 1004 (and conductive elements 1065 disposed therein) may be disposed at irregular intervals, be orientated radially, perpendicular and may additionally be linear, curved, concentric, involute curves or other orientation.

The conductive elements 1065 disposed in the body 1006 are generally provided to produce a bulk resistivity or a bulk surface resistivity of about 1 Ω-cm or less. In one aspect of the polishing article, the polishing article has a resistivity of about 1 Ω-cm or less. The conductive elements 1065 generally have mechanical properties that do not degrade under sustained electric fields and are resistant to degradation in acidic or basic electrolytes. In one embodiment, the conductive elements 1065 are sufficiently compliant or flexible as to maintain electrical contact between the entire contact surface 1008 and the substrate during processing. Sufficient compliant or flexible materials for the conductive element 1065 may have an analogous hardness of about 80 or less on the Shore D Hardness scale compared to the polishing material. A conductive element 1065 having an analogous hardness of about 50 or less on the Shore D Hardness scale for polymeric materials may be used.

In the embodiment depicted in FIG. 10A, the conductive elements 1065 are embedded in the polishing surface 1002 in a parallel, spaced-apart relation at regular intervals. At least one perforation 1010 is formed through the polishing article 205 between each conductive element 1065. An example of the conductive elements 1065 include conductive and compliant tubing fabricated from silicon filled with nickel-coated carbon. The conductive elements may also extend over only a portion of the width or diameter of the substrate surface, rather than across the entire surface of the polishing pas as shown in FIG. 10A.

Figure 10B:
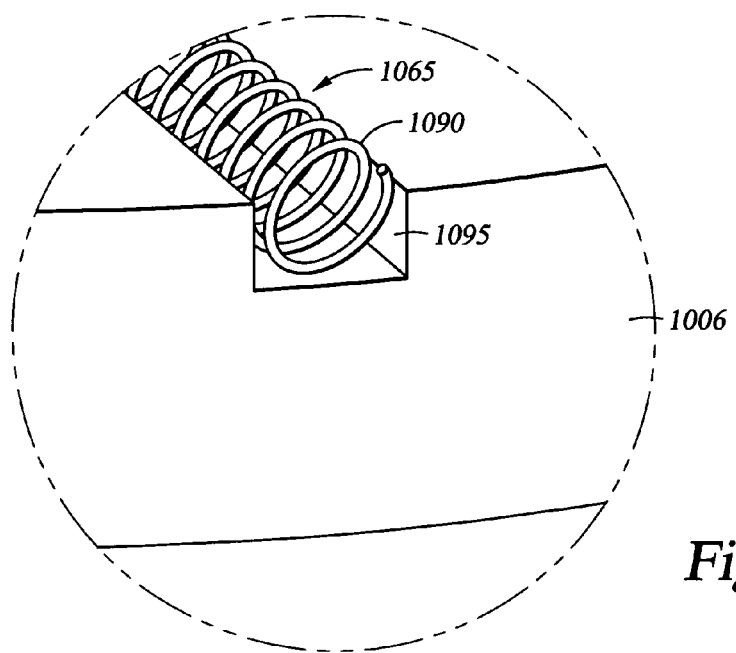
FIG. 10B is partial perspective view of another embodiment of a polishing article having a conductive element.

In another embodiment depicted in FIG. 10B, the conductive elements 1065 are comprised of a spring 1090 disposed in groove 195. The spring 1090 is fabricated or coated with an at least partially conductive material as described herein. The spring 1090 may extend above the polishing surface 1002 from the groove 195.

A connector 1030 is utilized to couple the conductive elements 1065 to a power source (not shown) to electrically bias the conductive elements 1065 while processing. The connector 1030 is generally a wire, tape or other conductor compatible with process fluids or having a covering or coating that protects the connector 1030 from the process fluids. The connector 1030 may be coupled to the conductive elements 1065 by soldering, stacking, brazing, clamping, crimping, riveting, fastening, conductive adhesive or by other methods or devices. Examples of materials that may be utilized in the connector 1030 include insulated copper, graphite, titanium, platinum, gold, and HASTELOY® among other materials.

Coatings disposed around the connectors 1030 may include polymers such as fluorocarbons, PVC and polyimide. In the embodiment depicted in FIG. 10A, one connector 1030 is coupled to each conductive element 1065 at the perimeter of the polishing article 205. Alternatively, the connectors 1030 may be disposed through the body 1006 of the polishing article 205. In yet another embodiment, the connector 1030 may be coupled to a conductive grid (not shown) disposed in the pockets and/or through the body 1006 that electrically couples the conductive elements 1065.

Figure 10C:
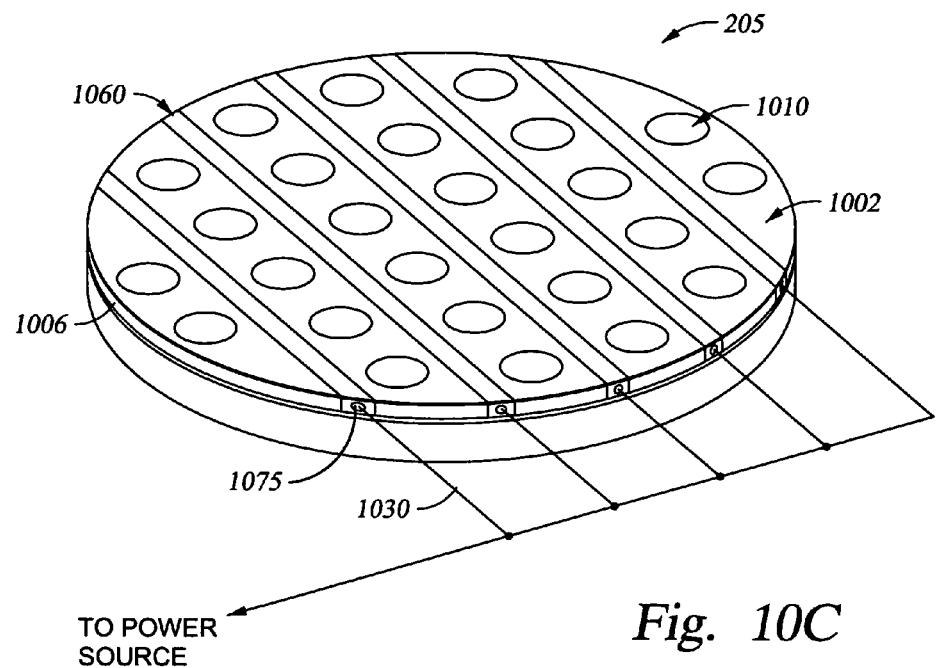
FIG. 10C is partial perspective view of another embodiment of a polishing article having a conductive element.
Figure 10D:
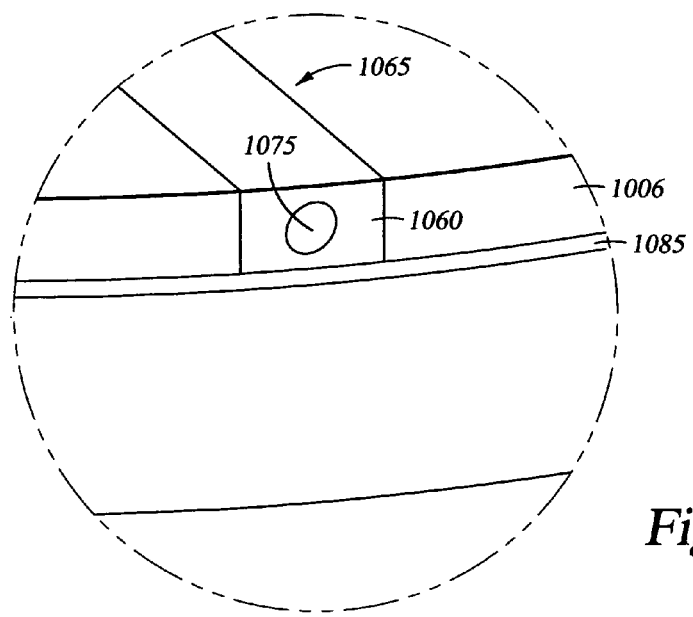
FIG. 10D is detailed view of the polishing article of FIG. 10C.

FIG. 10C illustrates another embodiment of the polishing article 205 having conductive elements 1065 comprising a conductive structure 1075 embedded in a conductive filler 1080, such as a conductive polymeric material as described above, including conductive polyurethane materials, disposed in the body 1006, which comprises a dielectric material, such as polyurethane. The conductive elements 1075 may be embedded in the body 1006 a parallel, spaced-apart relation at regular intervals. The conductive filler 1080 is generally planar with the polishing surface 1002. At least one perforation 1010 is formed through the polishing article 205 between each conductive element 1075. An example of the conductive element 1075 includes copper wire or tubing in a conductive polyurethane filler disposed in a body of polyurethane. A sub-pad 1085 may be disposed beneath the body 1006 and in contact with the conductive filler 1080. The sub-pad 1085 may be perforated and is primarily used to provide support for the body 1006 and the conductive elements 1075 disposed therein. The conductive elements may also extend over only a portion of the width or diameter of the substrate surface, rather than across the entire surface of the polishing pas as shown in FIG. 10C.

Figure 11A:
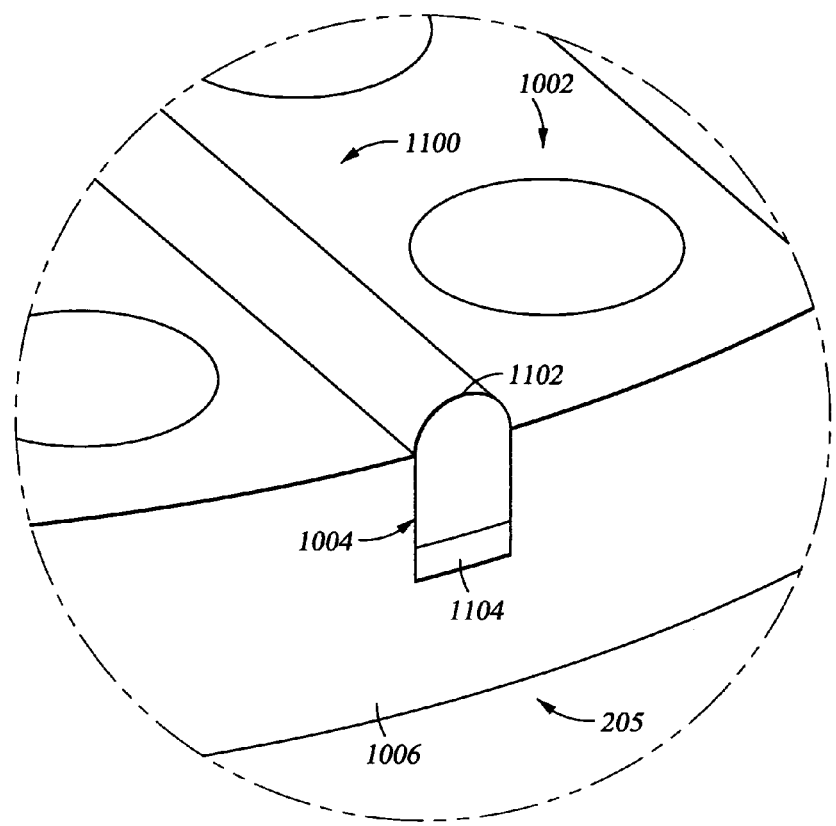
FIG. 11A is a partial sectional view of another embodiment of a conductive element.

FIG. 11A depicts another embodiment of a conductive member 1100 disposed in the pocket 1004 of the polishing article 205. The conductive member 1100 is generally an at least partially conductive bar, cylinder or coil that includes a contact surface 1102 that extends above a plane defined by the polishing surface 1002 of the body 1006. The contact surface 1102 is generally rounded to prevent damage to the substrate during processing.

A biasing member 1104 is disposed between the conductive member 1100 and the body 1006. The biasing member 1104 generally provides a bias that urges the conductive member 1100 away from the body 1006. The biasing member 1104 is comprised of a resilient material or device and may be a compression spring, flat spring, coil spring, a foamed polymer such as foamed polyurethane (e.g., PORON®), an elastomer, a bladder or other member or device that urges the conductive member 1100.

Figure 11B:
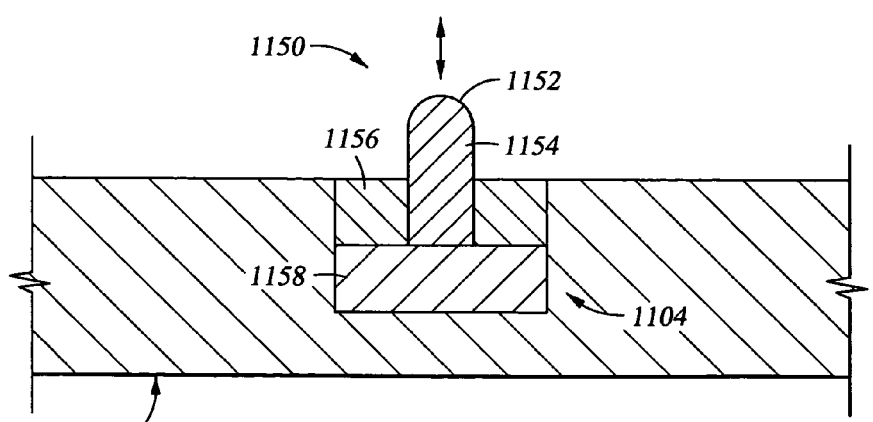
FIG. 11B is a partial sectional view of another embodiment of a conductive element.

FIG. 11B depicts another embodiment of a conductive member 1150 disposed in the pocket 1004 of the polishing article 205. The conductive member 1150 is generally comprises a plurality of balls or pins 1154. The pins 1154 are at least partially comprised and/or coated with an at least partially conductive material as described herein. Each pin 1154 includes a contact surface 1152 that extends above a plane defined by the polishing surface 1002 of the body 1006. The contact surface 1152 is generally rounded to prevent damage to the substrate during processing.

The pins 1154 are disposed through a bushing 1156 disposed in the pocket 1004. The pins 1154 may move through the bushing 1156 so that the contact surface 1152 of the pins 1154 may become coplanar with the polishing surface 1002 when polishing.

A biasing member 1158 is disposed between the conductive member 1150 and the body 1006. The biasing member 1158 generally provides a bias that urges the conductive member 1150 away from the body 1006. The biasing member 1158 is comprised of a resilient material or device and may be a compression spring, flat spring, coil spring, a foamed polymer such as foamed polyurethane (e.g., PORON®), an elastomer, a bladder or other member or device that urges the conductive member 1150. Typically, at least one of the biasing member 1158 or the bushing 1156 comprises a conductive material or coating to electrically couple the pins 1154.

Figure 12A:
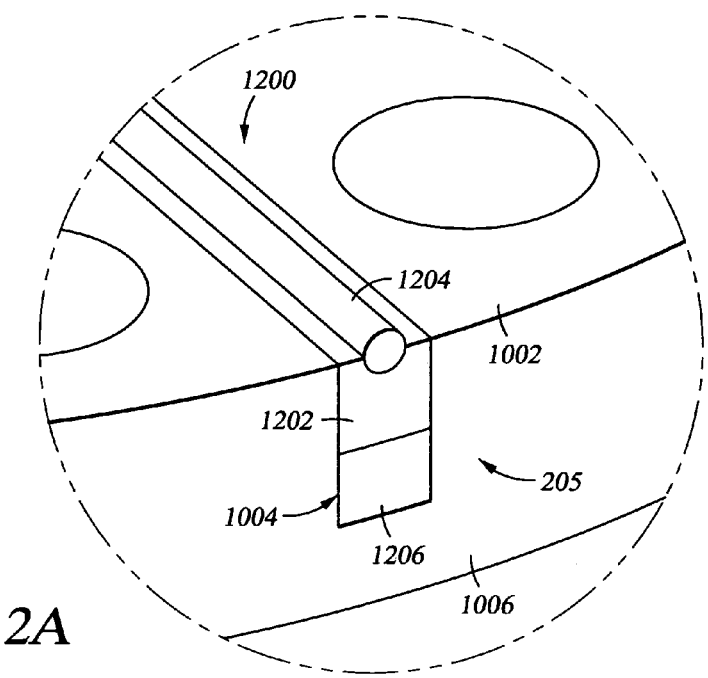
FIG. 12A is a partial sectional view of another embodiment of a conductive element.
Figure 12B:
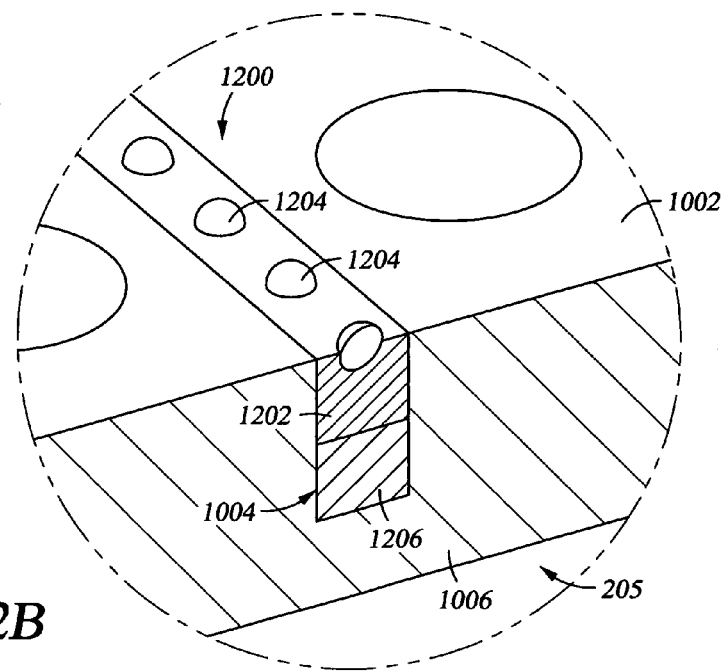
FIG. 12B is a partial sectional view of another embodiment of a conductive element.

FIGS. 12A–B depict alternative embodiments of a conductive member 1200 disposed in the pocket 1004 of the polishing article 205. The conductive member 1200 generally includes a carrier 1202 and a contact member 1204. A biasing member 1206 similar to the biasing member 1104 described herein is disposed between the carrier 1202 and body 1006 of the polishing article 205 for urging the contact member 1204 to a position at least partially above a plane defined by the polishing surface 1002 of the body 1006.

The carrier 1202 is typically formed from a conductive material such as graphite or a metal or other material compatible with process chemistries as described herein. Alternatively, other materials such as semiconductors or dielectric may be utilized. The carrier 1202 is configured to remain in contact with the contact member 1204 during processing.

The contact member 1204 is typically formed from a conductive material such as graphite or a metal or other at least partially conductive material compatible with process chemistries as described herein. The contact member 1204 is typically a cylinder, coil, bar or ball although other shapes maybe utilized. For example, the contact member 1204 is a graphite rod seated on a graphite carrier 1202 in the embodiment depicted in FIG. 12A and the contact member 1204 is a plurality of graphite or gold balls seated on and electrically coupled through a graphite carrier 1202 in the embodiment depicted in FIG. 12B.

Figure 13:
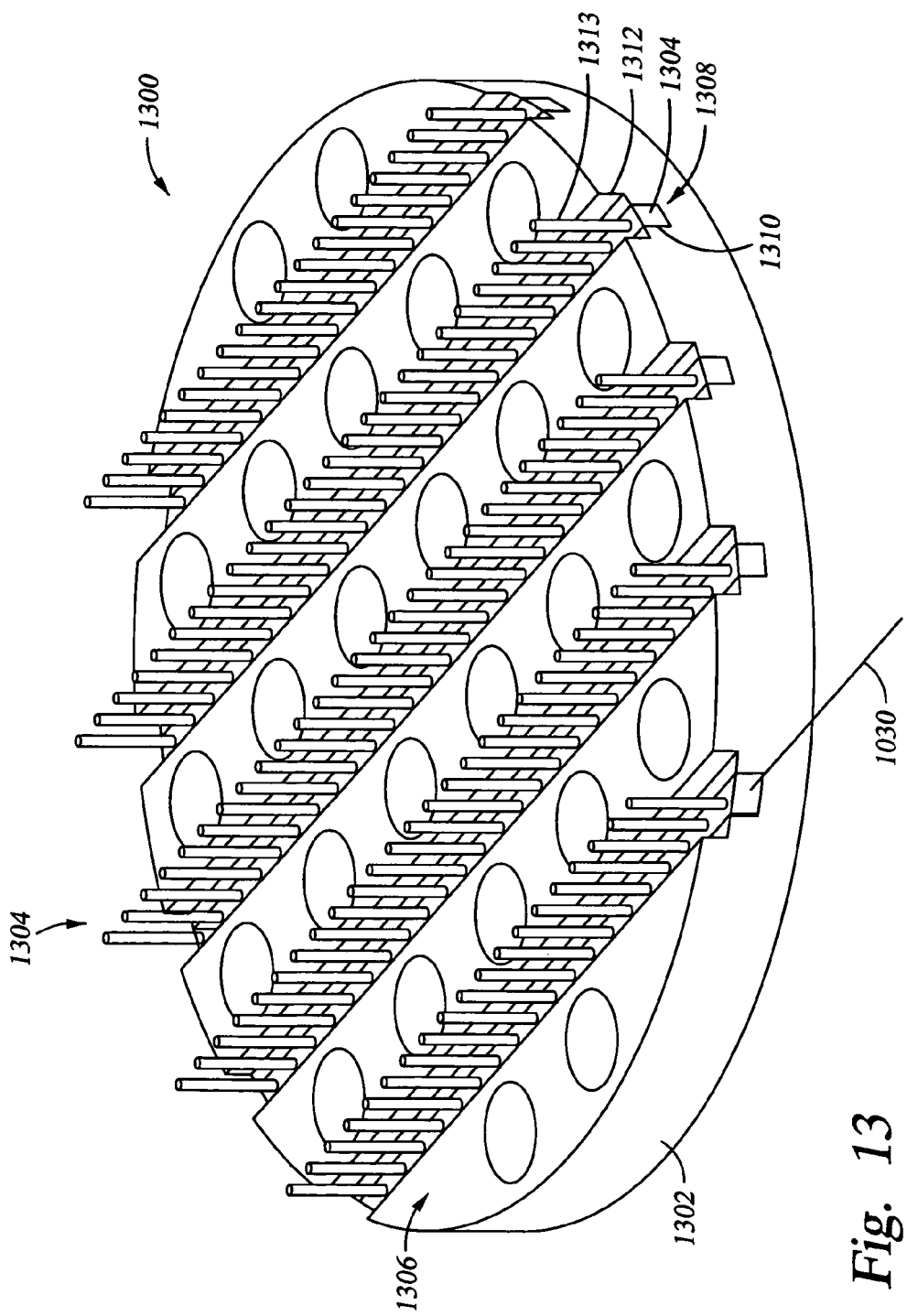
FIG. 13 is perspective view of another embodiment of a polishing article having a conductive element.

FIG. 13 depicts another embodiment of a polishing material 1300. The polishing material 1300 includes a body 1302 having one or more at least partially conductive elements 1304 disposed on a polishing surface 1306. The conductive elements 1304 generally comprise a plurality of fibers, strands, and/or flexible fingers with contact the substrate while processing. The conductive elements 1304 is comprised an at least partially conductive materials as described herein. In the embodiment depicted in FIG. 13, the conductive elements 1304 are a brush comprises a plurality of conductive sub-elements 1313 coupled to a base 1309. The conductive sub-elements 1313 include electrically conductive fibers, such as carbon fibers or other conductive, compliant (i.e., flexible) made from a conductive material described herein. The base 1309 also comprises an electrically conductive material and is coupled to a connector 1030.

The conductive elements 1304 generally are disposed in a pocket 1308 formed in the polishing surface 1306. The conductive elements 1304 may be orientated between 0 and 90 degrees relative to the polishing surface 1306. In embodiments where the conductive elements 1304 are orientated parallel to the polishing surface 1306, the conductive elements 1304 may partially be disposed on the polishing surface 1306.

The pockets 1308 have a lower mounting portion 1310 and an upper, clearance portion 1312. The mounting portion 1310 is configured to receive the base 1309 of the conductive elements 1304, and retain the conductive elements 1304 by press fit, clamping, adhesives or by other methods. The clearance portion 1312 is disposed where the pocket 1308 intersects the polishing surface 1306. The clearance portion 1312 is generally larger in cross section than the mounting portion 1310 to allow the conductive elements 1304 to flex when contacting a substrate while polishing without being disposed between the substrate and the polishing surface 1306.

Figure 14A:
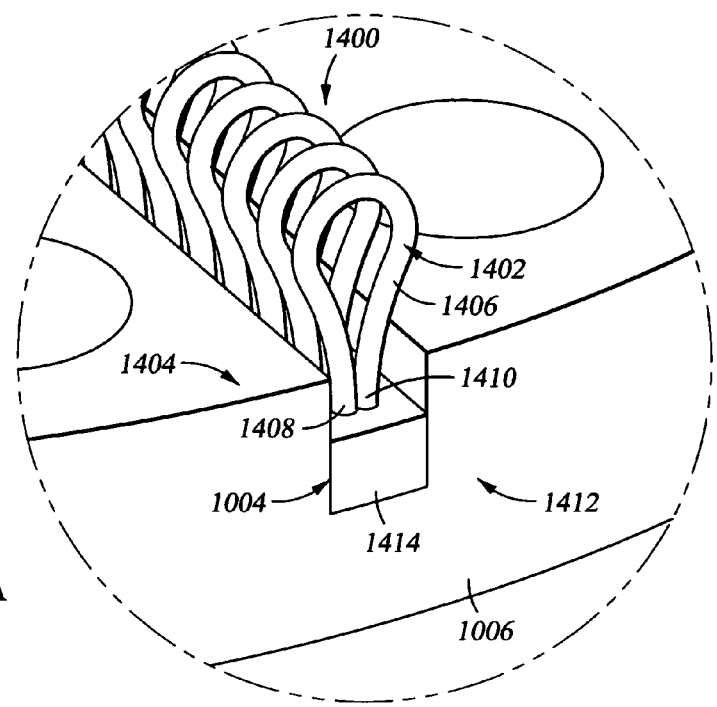
FIG. 14A is a partial perspective view of another embodiment of a polishing article.

FIG. 14A depicts one embodiment of a brush 1400 comprised of conductive elements 1402 (only four are shown for clarity). The brush 1400 is generally orientated between 0 to 90 degrees relative to a polishing surface 1404 and can be inclined in any polar orientation relative a line normal to the polishing surface 1404.

Each conductive element 1402 generally comprises a loop or ring 1406 having a first end 1408 and a second end 1410 disposed in a pocket 1412 formed in the polishing surface 1404. Each conductive element 1402 is typically coupled to an adjoining conductive element to form a plurality of loops 1406 extending above the polishing surface 1404. In the embodiment depicted in FIG. 14A, each loop 1406 is fabricated from graphite or conductive metal, such as gold, and are coupled by a tie wire base 1414 adhered to the pocket 1412. The contact height of the loop 1406 above the polishing surface is between about 1 millimeter and about 2 millimeters and the diameter of the material comprising the loop is between about 1 mil (thousandths of an inch) and about 2 mils. The tie wire base 1414 may be a conductive material, such as titanium. The tie wire base 1414 may also be coated in a layer of conductive material, such as copper, that dissolves from the polishing pad article during polishing.

Figure 14B:
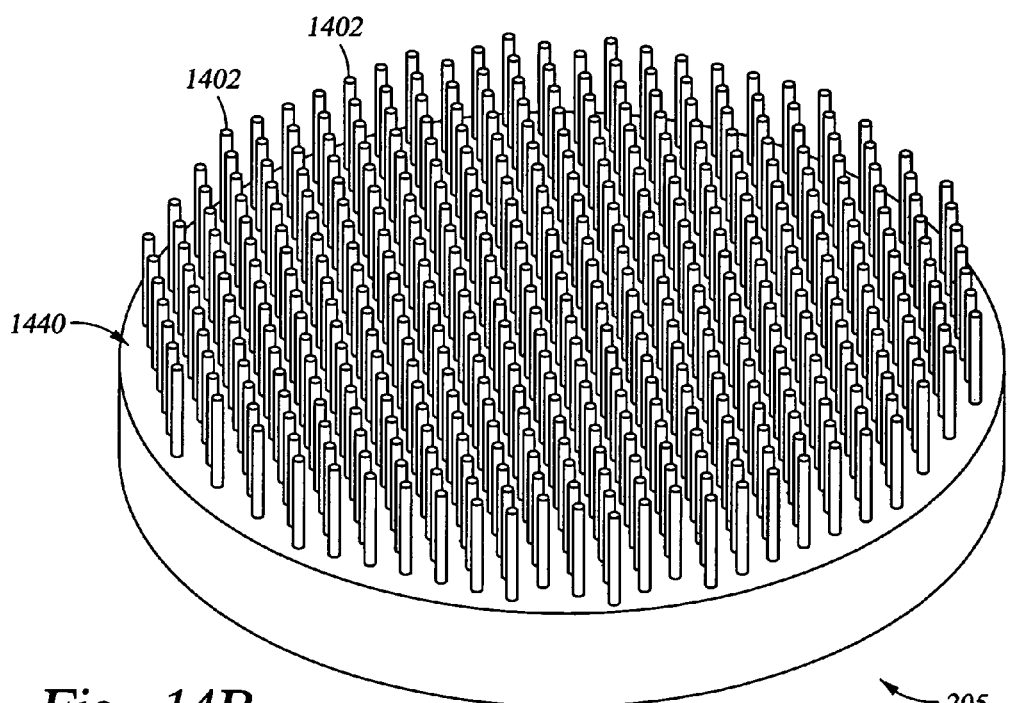
FIG. 14B is a perspective view of another embodiment of a polishing article.

FIG. 14B depicts another embodiment of a brush 1400 having a conducting surface 1440 and a plurality of discreet conductive elements 1402 formed thereon. The conductive elements 1402 generally comprise fibers of a conductive material, such as carbon, vertically displaced from the conducting surface 1440 of the polishing article 205 and horizontally displaced from each other. The conducting elements 1402 of the brush 1400 are generally orientated between 0 to 90 degrees relative to a conducting surface 1440 and can be inclined in any polar orientation relative a line normal to the conducting surface 1440. The conductive elements 1402 may be formed across the length of the polishing pads, as shown in FIG. 14B or may only be partially disposed in the polishing pad. The contact height of the conductive elements 1402 above the polishing surface may be up to about 5 millimeters and the diameter of the material comprising the conductive element 1402 is between about 1 mil (thousandths of an inch) and about 2 mils. The height above the polishing surface and the diameter of the conductive elements 1402 may vary upon the polishing process being performed.

Alternatively, the conducting elements 1402 may comprise a conducting wire of copper, platinum, platinum-coated copper, aluminum, or combinations thereof. The conducting surface 1440 may comprise a metal material, such as a copper sheet, a platinum sheet, or a platinum coated copper sheet.

The fibers of the conductive elements 1402 are compliant enough to deform under a contact pressure while maintaining an electrical contact with a substrate surface with reduced or minimal scratching of the substrate surface. Generally, the substrate surface only contacts the conductive elements 1402 of the polishing article 205. The conductive elements 1402 are positioned so as to provide a uniform current density over the surface of the polishing article 205.

The conductive elements 1402 are adhered to the conducting surface by a non-conductive, or dielectric, adhesive or binder. The non-conductive adhesive may provide a dielectric coating to the conducting surface 1440 to provide an electrochemical barrier between the conducting surface 1440 and any surrounding electrolyte. The conducting surface 1440 may be in the form of a round polishing pad or a linear web or belt of polishing article 205. A series of perforations (not shown) may be disposed in the conducting surface 1440 for provided flow of electrolyte therethrough.

While not shown, the conductive plate may be disposed on a support pad of conventional polishing material for positioning and handling of the polishing article 205 on a rotating or linear polishing platen.

Figure 14C:
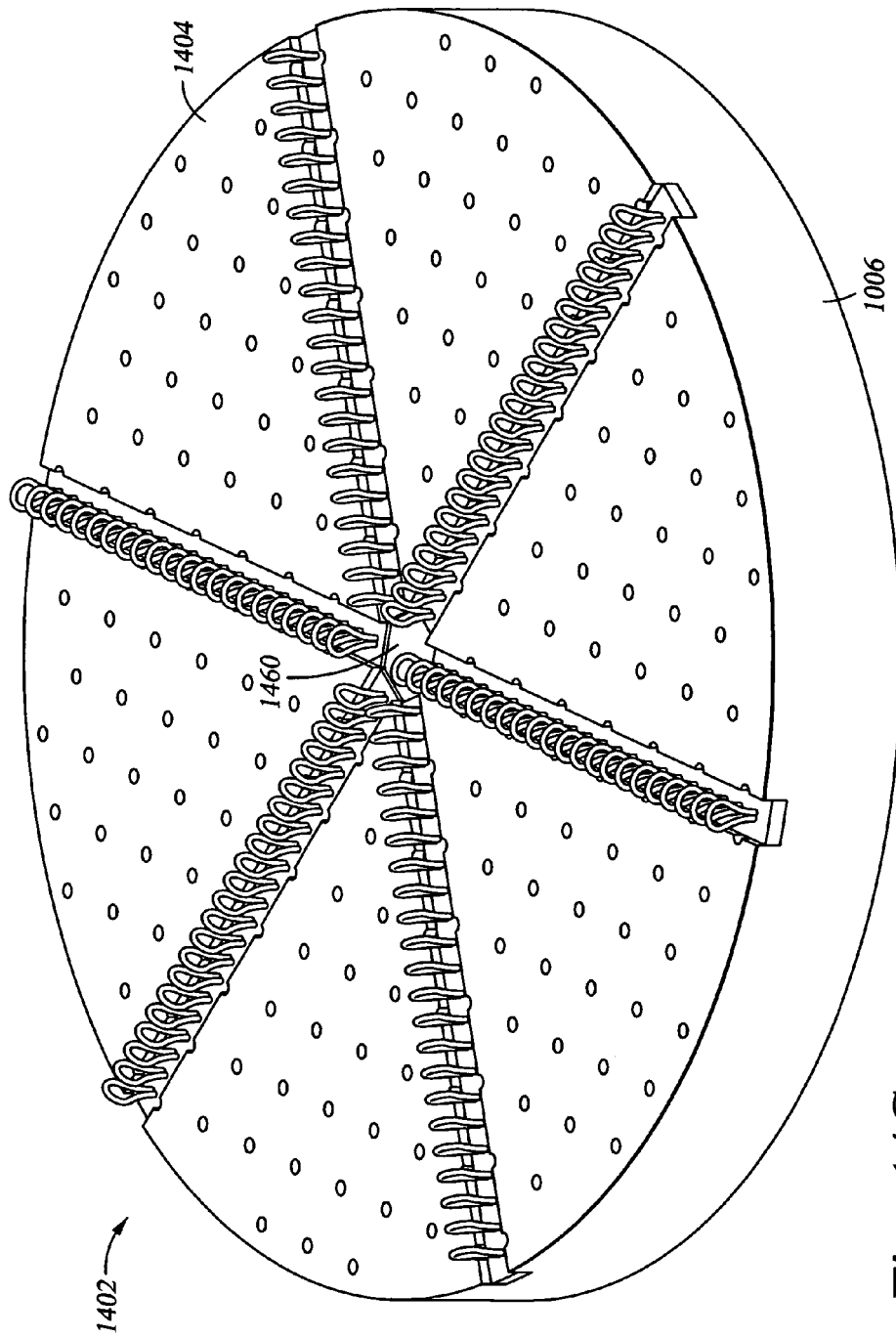
FIG. 14C is a partial perspective view of another embodiment of a polishing article.

FIG. 14C shows another embodiment of a brush 1400 having a plurality conductive elements 1402, disposed in a radial pattern from the center of the substrate to the edge. The plurality of conductive elements may be displaced from each other at intervals of 15°, 30°, 45°, 60°, and 90° degrees, or any other combinations desired. The conductive elements 1402 are generally spaced to provide as uniform application of current or power for polishing of the substrate. The conductive elements may be further spaced so as to not contact each other. Wedge portions 1404 of a dielectric polishing material of the body 1006 may be configured to electrically isolate the conductive elements 1402. A spacer or recessed area 1460 is also formed in the polishing article to also isolate the conductive elements 1402 from each other. The conductive elements 1402 may be in the form of loops as shown in FIG. 14A or vertical extending fibers as shone in FIG. 14B.

Figure 14D:
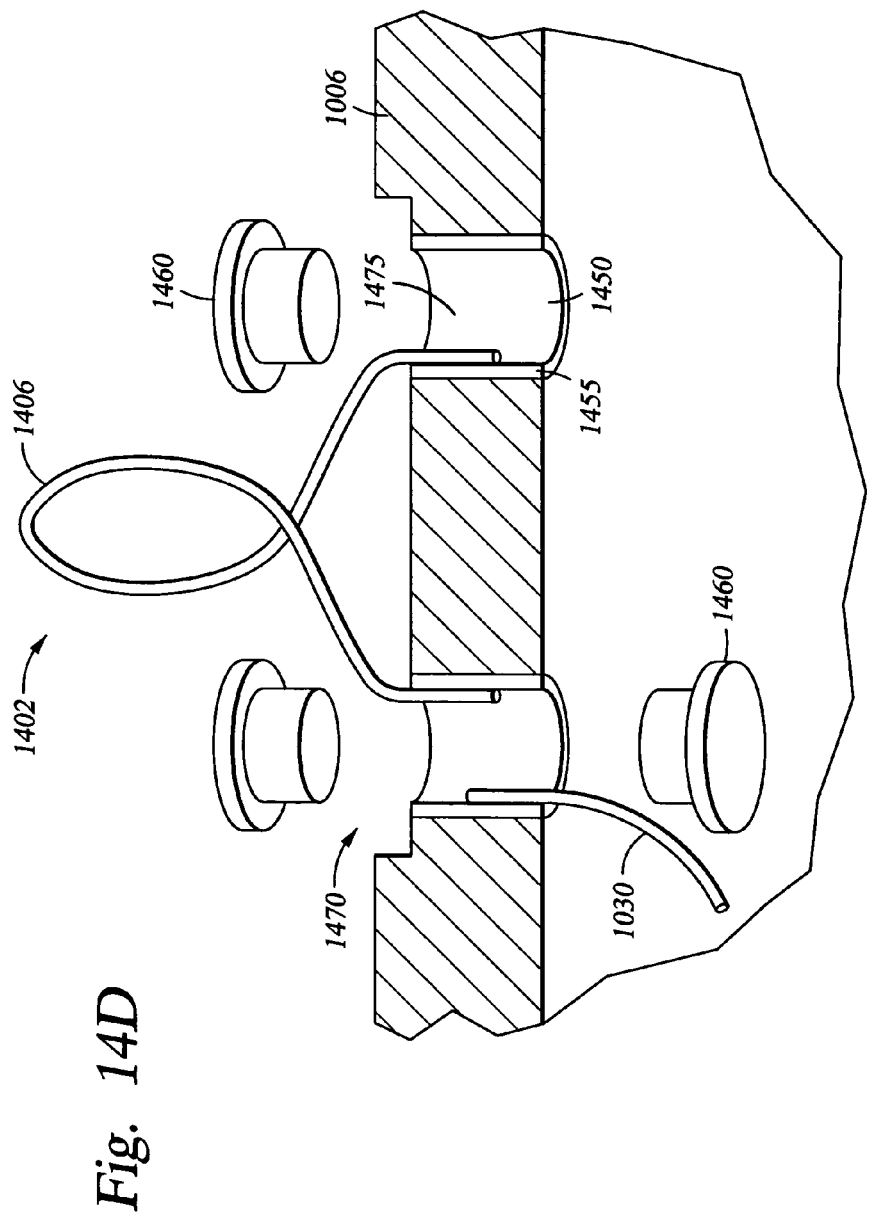
FIG. 14D shows another embodiment of a polishing article having conductive elements comprising loops secured to the polishing article.

FIG. 14D shows another embodiment of forming the conductive elements 1402 having loops 1406 formed therein and securing the conductive elements to the body 1006 of the polishing article. Passages 1450 are formed in the body 1006 of the polishing article intersecting grooves 1470 for the conductive elements 1402. An insert 1455 is disposed in the passages 1450. The insert 1455 comprises a conductive material, such as gold or the same material as the conductive element 1406. Connectors 1030 may then be disposed in the passages 1450 and contacted with the insert 1455. Ends 1475 of the conductive element 1402 may be contacted with the insert 1455 for flow of power therethrough. The ends 1475 of the conductive element 1402 and the connectors 1030 are then secured to the conductive insert 1455 by dielectric inserts 1460. The invention contemplated using the passages for every loop 1406 of the conductive element 1402, at intervals along the length of the conductive element 1402, or only at the extreme ends of the conductive element 1402.

Further examples of conductive polishing pads are described in U.S. Provisional Patent Application Ser. No. 60/258,162, filed Dec. 22, 2001, which is incorporated by reference to the extent not inconsistent with the aspects and claims herein.

Conductive Polishing Article Processing

In operation, the polishing article 205 is disposed on the disc 206 in an electrolyte in the basin 202. A substrate 114 on the polishing head is disposed in the electrolyte and contacted with the polishing article 205. Electrolyte is flowed through the perforations of the disc 206 and the polishing article 205 and is distributed on the substrate surface by grooves formed therein. Power from a power source is then applied to the conductive polishing article 205 and the electrode 204, and conductive material, such as copper, in the electrolyte is then removed by an anodic dissolution method.

The substrate 114 and polishing article 205 are rotated relative to one another to polish the substrate surface. When contacting the substrate surface, the polishing article 205 typically applies a pressure of about 6 psi or less to the substrate surface. A pressure between of about 2 psi or less is used with substrate containing low dielectric constant material between the substrate 114 and the polishing article 205 during polishing of the substrate.

Electrolyte solutions may include commercially available electrolytes. For example, in copper containing material removal, the electrolyte may include sulfuric acid based electrolytes or phosphoric acid based electrolytes, such as potassium phosphate ($K_3PO_4$), or combinations thereof. The electrolyte may also contain derivatives of sulfuric acid based electrolytes, such as copper sulfate, and derivatives of phosphoric acid based electrolytes, such as copper phosphate. Electrolytes having perchloric acid-acetic acid solutions and derivatives thereof may also be used. Additionally, the invention contemplates using electrolyte compositions conventionally used in electroplating or electropolishing processes, including conventionally used electroplating or electropolishing additives, such as brighteners among others. In one aspect of the electrolyte solution, the electrolyte may have a concentration between about 0.2 and about 1.2 Molar of the solution.

As one example, copper sulfate ($CuSO_4$) can be used as the electrolyte. One source for electrolyte solutions used for electrochemical processes such as copper plating, copper anodic dissolution, or combinations thereof is Shipley Leonel, a division of Rohm and Haas, headquartered in Philadelphia, Pa., under the tradename Ultrafill 2000.

In anodic dissolution, the bias is applied between the electrode 204, performing as a cathode, and the conductive article support layer 520 of the polishing article 205, performing as the anode. The substrate in contact with the polishing article is polarized via the conductive polishing surface article 510 at the same time the bias is applied to the conductive article support member. The application of the bias allows removal of conductive material, such as copper-containing materials, formed on a substrate surface. The bias may include the application of a voltage of about 15 volts or less to the substrate surface. A voltage between about 0.1 volts and about 10 volts may be used to dissolve copper-containing material from the substrate surface and into the electrolyte.

Alternatively, the bias may be a current density between about 0.1 milliamps/cm$^2$ and about 50 milliamps/cm$^2$, or between about 0.1 amps to about 20 amps for a 200 mm substrate. It is believed that biasing the substrate from the polishing article 205 provides uniform dissolution of conductive materials, such as metals, into the electrolyte from the substrate surface as compared to the higher edge removal rate and lower center removal rate from conventional edge contact-pins bias.

The bias applied to perform the anodic dissolution process may be varied in power and application depending upon the user requirements in removing material from the substrate surface. For example, a time varying anodic potential may be provided to the conductive polishing article 205. The bias may also be applied by electrical pulse modulation techniques. The electrical pulse modification technique comprises applying a constant current density or voltage over the substrate for a first time period, than applying a constant reverse voltage over the substrate for a second time period, and repeating the first and second steps. For example, the electrical pulse modification technique may use a varying potential from between about −0.1 volts and about −15 volts to between about 0.1 volts and about 15 volts.

Conductive material, such as copper containing material can be removed from at least a portion of the substrate surface at a rate of about 15,000 Å/min or less, such as between about 100 Å/min and about 15,000 Å/min. In one embodiment of the invention where the copper material to be removed is less than 5,000 Å thick, the voltage may be applied to the conductive polishing article 205 to provide a removal rate between about 100 Å/min and about 5,000 Å/min.

Power may be coupled into the polishing articles 205 described above by using a power transference device, such as a power inlet bar, for conductive polishing materials that do not have readily available power coupling points, such as a polishing material comprising carbon fibers or carbon nanotubes disposed in polyurethane. A power transference device is typically configured to provide a linear voltage reduction in equipotent lines to the polishing material. The highest potential is closest to the power inlet bar and the lowest potential is furthest from the power inlet bar. The power transference device typically has a greater conductivity than the conductive material, such as metal, i.e., platinum or copper. The polishing article may be of any possible shape, i.e., a round polishing pad or linear belt, and the power transference device may be of any shape, such as a bar inlet bar or conductive mesh. The power transference device usually has a substrate facing side at least as wide or long as the diameter of the substrate.

Substrate rotation on the polishing pad will equalize or average out the potential imparted to the substrate surface during polishing to provide for more uniform material deposition rate or removal rate. The substrate may move or "sweep" parallel to the power inlet bar to provide for improved polishing without detrimentally affecting uniformity in deposition rates or removal rates. Perpendicular movement is also contemplated for polishing.

The power transference device can be located either outside the electrolyte or immersed in the electrolyte if properly composed of or encapsulated with a material that will not react with the surrounding electrolyte as described for the conductive materials above. For example, a copper power inlet bar may be used for providing power external of an electrolyte and a platinum power inlet bar or platinum covered copper power inlet bar may be used submerged in an electrolyte solution. The power pad is connected to a power source via a power cord.

Figure 15A:
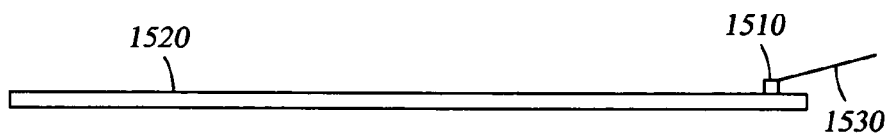
FIGS. 15A–D are schematic top and side views of one embodiment of a inlet power pad mounted on the polishing article described herein.
Figure 15B:
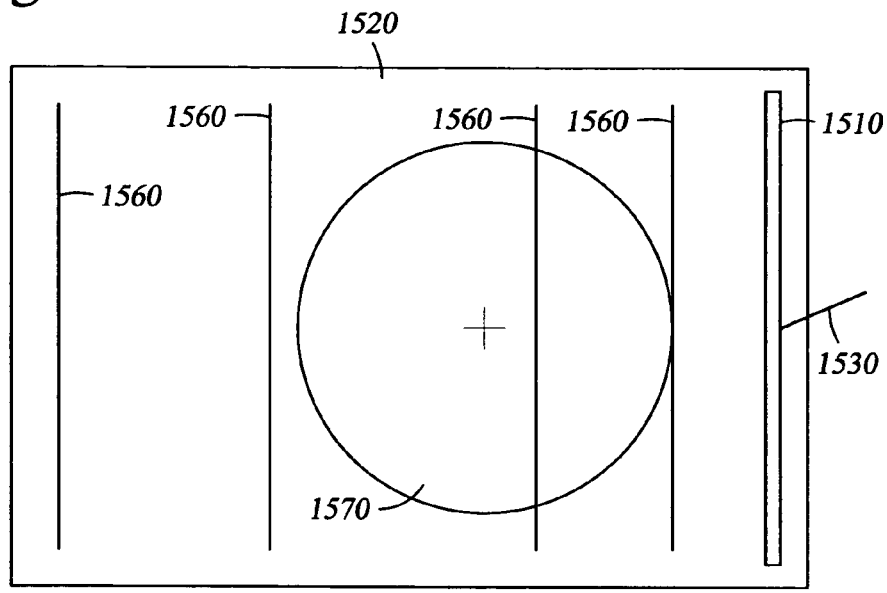
Figures 15C, 15D:
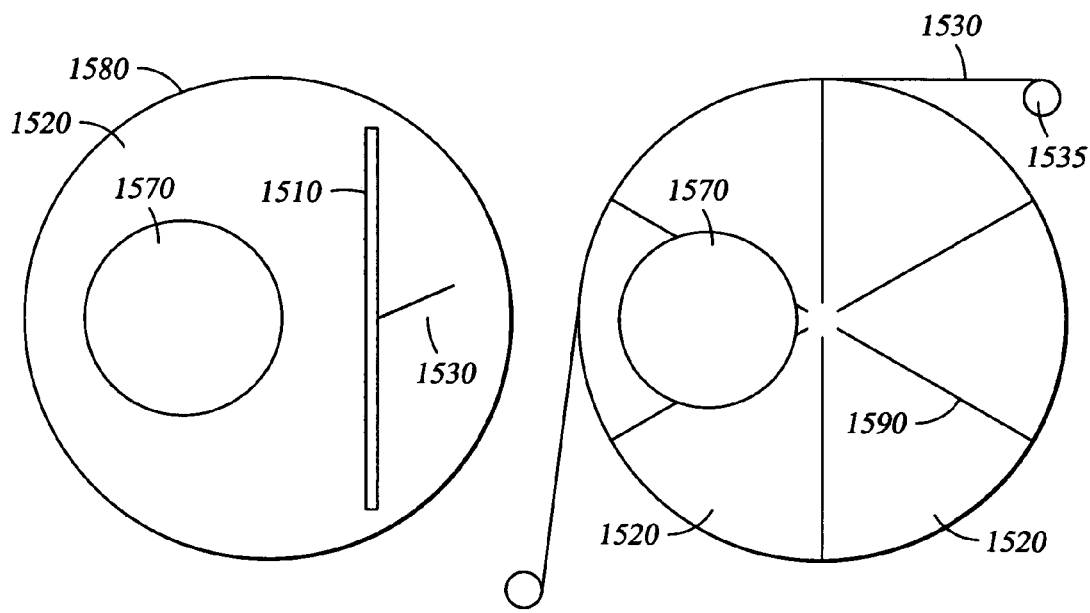

FIGS. 15A–15C illustrate one embodiment of a power inlet bar disposed on polishing article described herein. FIG. 15A is a schematic side view of a power inlet bar 1510 disposed on an edge portion of a conductive perforated polishing material 1520. The power inlet bar 1510 is coupled to a power source (not shown) by a power cord 1530.

FIG. 15B illustrates the power inlet bar 1510 disposed on a linear belt or web 1550 of conductive, perforated polishing material 1520. Equipotent lines 1560 of the linear voltage reduction from the power bar across the conductive, perforated polishing material 1520 in equipotent lines is shown in relationship to a substrate 1570 being rotated counter-clockwise. FIG. 15C illustrates one embodiment of a power inlet bar 1510 being mounted on a round polishing pad 1580 of conductive, perforated polishing material 1520. Both figures depict the power inlet bar 1510 as wider than the diameter of the substrate to be polished.

FIG. 15D shows an alternative embodiment supplying power to the conductive elements 1590. A power strip 1530 is connected to a power source 1535 and a side of the polishing material 1520. The power strip 1530 and polishing material 1520 are configured to electrically conduct power from the power strip 1530 and the conductive elements 1590 during rotation of the polishing pad. For example, the conductive element 1590 has an exposed contact on the side of the polishing material 1520 for contacting the power strip 1530. The power strip 1530 may comprise a conductive tape, such as copper tape. The conductive elements 1590 and power strip 1530 are electrically connected for between about 20% and 60%, for example, about 40%, of the rotation period of the polishing material 1520.

Polishing Pad Materials

The conductive polishing material may include conductive polymers, polymer composites with conductive materials, conductive metals, conductive fillers or conductive doping materials, or combinations thereof. Alternatively, the conductive polishing material may form a composite of a conductive polishing material as a polishing layer disposed on a conventional, dielectric, polishing material as a support layer.

Conductive polymers include polymeric materials that are intrinsically conductive, such as polyacetylene, polyethylenedioxythiophene (PEDT), which is commercially available under the trade name Baytron™, polyaniline, polypyrrole, and combinations thereof. Another example of a conductive polymer is silicon filled with nickel-coated carbon.

The polymer composites with conductive materials include polymer-noble metal hybrid materials. Polymer-noble metal hybrid materials that may be used as the conductive polishing material described herein are generally chemically inert with a surrounding electrolyte, such as those with noble metals that are resistant to oxidation. An example of a polymer-noble metal hybrid material is a platinum-polymer hybrid material. The invention contemplates the use of polymer-noble metal hybrid materials that are chemically reactive with a surrounding electrolyte when the polymer-noble metal hybrid material is insulated from a surrounding electrolyte by another material.

The conductive polishing material may include conductive metals. Conductive metals that may be used as the polishing material are those metals that are relatively inert to chemical reactions with the surrounding electrolyte. Platinum is an example of a conductive metal that may be used as the polishing material. The conductive metals may form a portion or the entire polishing surface of the polishing material. When forming a portion of the polishing surface, the conductive metals are typically disposed in a conventional polishing material.

The conductive polishing materials may further include conductive fillers or conductive doping materials disposed in a binder material, such as the conductive polymers described herein or a conventional polishing material. Examples of conductive fillers include carbon powder, carbon fibers, carbon nanotubes, carbon nanofoam, carbon aerogels, and combinations thereof. Carbon nanotubes are conductive hollow filaments of carbon material having a diameter in the micron and nanometer size range. The conductive fillers or conductive doping materials are disposed in the binding material in an amount sufficient to provide a polishing article having a desired conductivity. The binder material is typically a conventional polishing material.

The conductive material may alternatively be a conductive or dielectric material at least partially coated or covered with an at least partially conductive material such as those described herein. For example, the conductive material may be gold plated dielectric materials. Conductive materials may include other conductive materials and/or metals that are relatively inert to chemical reactions with the surrounding electrolyte. One material that may be used is graphite.

Composites of conductive and conventional polishing materials include conductive polishing materials disposed in a conventional polishing material or a conductive material layer disposed on a conventional polishing material. Conventional polishing materials are generally dielectric materials and may include polymeric materials, such as polyurethane, polycarbonate, polyphenylene sulfide (PPS), or combinations thereof, and other polishing materials used in polishing substrate surfaces. The conventional polishing material may also include fillers and/or be in a foamed state.

An exemplary conventional material includes dielectric material, such as polyurethane and polyurethane mixed with fillers, found in the IC series of polishing article, including IC-1010, which are commercially available from Rodel Inc., of Phoenix, Ariz. The invention further contemplates the use of other conventional polishing materials, such as a layer of compressible material. The compressible material includes a conventional soft material, such as compressed felt fibers leached with urethane.

Mechanical properties of the conventional polishing materials used in the conductive polishing article herein provide, for example, a hardness of about 50 or greater on the Shore D Hardness scale for polymeric materials as described and measured by the American Society for Testing and Materials (ASTM), headquartered in Philadelphia, Pa.

Generally, the conductive polishing material or the composite of the conductive polishing material and conventional polishing material are provided to produce a conductive polishing article having a bulk resistivity or a bulk surface resistivity of about 10 $\Omega$-cm or less. In one aspect of the polishing article, the polishing article has a resistivity of about 1 $\Omega$-cm or less. An example of the conductive polishing material is a layer of platinum, which has a resistivity 9.81 $\mu\Omega$-cm at 0° C., disposed on a layer of polyurethane.

The composite of the conductive polishing material and conventional polishing material may include between about 5 wt. % and about 60 wt. % of conductive polishing material in the polishing article 205. An example of a composite of the conductive polishing material and conventional polishing material includes carbon fibers or carbon nanotubes, both of which exhibit resistivities of 1 $\Omega$-cm or less, disposed in a conventional polishing material of polycarbonate or polyurethane in sufficient amounts to provide a polishing article having a bulk resistivity of about 10 $\Omega$-cm or less.

Examples of conductive material in the polishing articles 205 described above are the following. Referring back to FIGS. 3 and 4, an example of the conductive polishing portion 310 or conductive polishing surface article 410 includes between about 5 wt. % and about 60 wt. % of carbon fibers or carbon nanotubes disposed in a conventional polishing material of polycarbonate or polyurethane. The carbon fibers or carbon nanotubes are generally provided in sufficient amounts to produce a conductive polishing surface article 410 having a bulk resistivity of about 10 $\Omega$-cm or less. Another example of the polishing article 205 is a layer of platinum forming the conductive polishing portion 310 or conductive polishing surface article 410 disposed on a layer of polyurethane.

Referring back to FIG. 6, an example of the polishing surface includes a metal mesh of platinum, gold, or platinum coated copper in a conventional polishing material of polyurethane. The metal mesh providing a bulk resistivity of about 10 $\Omega$-cm or less.

The conductive polishing materials and the conventional polishing materials generally have mechanical properties which do not degrade under sustained electric fields and are resistant to degradation in acidic or basic electrolytes. Generally, the conductive polishing materials and the composite of conductive polishing materials and conventional polishing materials have mechanical properties similar to that of conventional polishing materials alone. For example, the combination of materials has a hardness of about 50 or greater on the Shore D Hardness scale for polymeric materials as described and measured by the American Society for Testing and Materials (ASTM), headquartered in Philadelphia, Pa. In one aspect, the combination of materials has a hardness of about 80 or greater on the Shore D Hardness scale for polymeric materials. Additionally, the polishing article 205 generally includes a surface roughness of about 1 micron or less.

Alternatively, the polishing article 205 may comprise a metal mesh disposed in the conventional polishing material. The metal mesh may comprise a chemically inert conductive material, such as platinum, which has a resistivity 9.81 $\mu\Omega$-cm at 0° C. The metal mesh may also include materials that have been observed to react with the surrounding electrolyte, such as copper which has a resistivity of 1.6 $\mu\Omega$-cm at 0° C., if the metal mesh is chemically insulated from the electrolyte such as by a conformal layer of conventional material.

Further, the invention contemplates the use of abrasive materials embedded in the conventional polishing material. In such an embodiment, the fixed abrasive particles generally include conductive abrasive materials. The invention further contemplates other polishing article configurations, such as polishing webs and linear polishing belts, in addition to polishing pads.

While foregoing is directed to various embodiments of the invention, other and further embodiments of the invention may be devised without departing from the basic scope thereof, and the scope thereof is determined by the claims that follow.

What is claimed is:

1. An article of manufacture for polishing a substrate, comprising:

a conductive material layer; and a polishing material disposed on the conductive material layer, wherein the polishing material comprises a body having at least a partially conductive surface adapted to polish the substrate, wherein the polishing material and the conductive material layer each have a plurality of perforations formed therein and a plurality of grooves are disposed in the partially conductive surface, and wherein at least a portion of the plurality of grooves intersect with at least a portion of the plurality of perforations.

2. The article of claim 1, wherein the conductive material layer is coupled to a power source.

3. The article of claim 1, wherein the conductive material layer comprises a metal film.

4. The article of claim 3, wherein the metal film comprises a noble metal film.

5. The article of claim 2, wherein the conductive material layer further comprises one or more conductive contacts for coupling to a power source.

6. The article of claim 1, wherein the polishing material comprises a conductive material disposed in a polymer binder.

7. The article of claim 6, wherein the conductive material comprises a conductive filler selected from the group of carbon powder, carbon fibers, carbon nanotubes, carbon nanofoam, carbon aerogels, and combinations thereof, and the polymer binder comprises a dielectric material selected from the group of polyurethane, polycarbonate, polyphenylene sulfide, filled polymers, foamed polymers, and combinations thereof.

8. An article of manufacture for polishing a substrate, comprising:

a conductive material layer; and a polishing material disposed on the conductive material layer, wherein the polishing material comprises a body having at least a partially conductive surface adapted to polish the substrate, wherein the article of manufacture is disposed on a polishing article support comprising a plurality of perforations disposed therein for flow of material therethrough.

9. The article of claim 8, wherein a plurality of perforations in the polishing material and conductive material layer are aligned with the plurality of perforations of the polishing article support.

10. The article of claim 1, wherein the conductive surface has a resistivity of about 10 $\Omega$-cm or less.

11. An article of manufacture for polishing a substrate, comprising:

a perforated dielectric support layer;

a perforated conductive material layer disposed on the perforated dielectric support layer; and a polishing material disposed on the conductive material layer, wherein the polishing material comprises a body having at least a partially conductive polishing surface adapted to polish the substrate and a plurality of perforations formed therein, a plurality of grooves disposed in the polishing surface, or both.

12. The article of claim 11, wherein the article of manufacture is disposed on a polishing article support comprising a plurality of perforations disposed therein for flow of material therethrough.

13. The article of claim 12, wherein a plurality of perforations in the polishing material, the conductive material layer, and the dielectric support layer are aligned with the plurality of perforations of the polishing article support.

14. The article of claim 11, wherein the conductive material layer is coupled to a power source by one or more conductive contacts.

15. The article of claim 11, wherein the conductive material layer comprises a metal film and the polishing material comprises a conductive material disposed in a polymer binder.

16. The article of claim 15, wherein the conductive material layer comprises a noble metal, the conductive material comprises a conductive filler selected from the group of carbon powder, carbon fibers, carbon nanotubes, carbon nanofoam, carbon aerogels, and combinations thereof, and the polymer binder comprises a dielectric material selected from the group of polyurethane, polycarbonate, polyphenylene sulfide, filled polymers, foamed polymers, and combinations thereof.

17. The article of claim 11, wherein the conductive surface has a resistivity of about 10 $\Omega$-cm or less.

18. The article of claim 11, wherein at least a portion of the plurality of grooves of the polishing surface of the polishing article intersect with at least a portion of a plurality of perforations disposed in the polishing article, the conductive material layer, and the dielectric support layer.

* * * * *

UNITED STATES PATENT AND TRADEMARK OFFICE
CERTIFICATE OF CORRECTION

PATENT NO. : 6,988,942 B2  Page 1 of 1
APPLICATION NO. : 10/894756
DATED : January 24, 2006
INVENTOR(S) : Liang-Yuh Chen et al.

It is certified that error appears in the above-identified patent and that said Letters Patent is hereby corrected as shown below:

Column 1, Lines 52-54: Delete "chemical vapor deposition (CVD), plasma-enhanced chemical vapor deposition (PECVD), and electrochemical plating (ECP)."

Column 2, Line 16: Insert a period after "substrate"

Column 4, Line 55: Change "a" to --an--

Column 10, Line 26: Change "a" to --an--

Column 12, Line 8: Change "a" to --an--

Column 15, Line 46: Change "1" to --10--

Column 16, Line 4: Change "pas" to --pad--

Column 16, Line 55: Change "pas" to --pad--

Column 17, Line 53: Change "maybe" to --may be--

Column 19, Line 51: Change "shone" to --shown--

Column 20, Line 27: Delete "between"

Signed and Sealed this

Fourteenth Day of November, 2006

JON W. DUDAS
*Director of the United States Patent and Trademark Office*